(12) United States Patent
Maltz

(10) Patent No.: US 11,941,731 B2
(45) Date of Patent: Mar. 26, 2024

(54) SYSTEMS AND METHODS FOR IMAGE PROCESSING

(71) Applicant: SHANGHAI UNITED IMAGING HEALTHCARE CO., LTD., Shanghai (CN)

(72) Inventor: Jonathan Maltz, Houston, TX (US)

(73) Assignee: SHANGHAI UNITED IMAGING HEALTHCARE CO., LTD., Shanghai (CN)

(*) Notice: Subject to any disclaimer, the term of this patent is extended or adjusted under 35 U.S.C. 154(b) by 512 days.

(21) Appl. No.: 17/105,613

(22) Filed: Nov. 26, 2020

(65) Prior Publication Data

US 2021/0104080 A1 Apr. 8, 2021

(51) Int. Cl.
*G06T 11/00* (2006.01)
*G06F 30/27* (2020.01)

(52) U.S. Cl.
CPC ............ *G06T 11/006* (2013.01); *G06F 30/27* (2020.01); *G06T 2211/40* (2013.01)

(58) Field of Classification Search
CPC .. G06T 11/006; G06T 2211/40; G06T 11/008; G06T 3/0031; G06T 7/30; G06T 2207/10081; G06T 2207/20081; G06T 2207/20084; G06F 30/27; G16H 30/40; G16H 30/20; G06N 3/044; G06N 3/048; G06N 3/08
See application file for complete search history.

(56) References Cited

U.S. PATENT DOCUMENTS

| | | | |
|---|---|---|---|
| 11,551,059 B1* | 1/2023 | Yang | G06N 3/0464 |
| 2012/0114095 A1* | 5/2012 | Smith | A61B 6/461 |
| | | | 378/20 |
| 2016/0005163 A1* | 1/2016 | Markov | G06T 7/0012 |
| | | | 382/128 |
| 2019/0099619 A1* | 4/2019 | Maltz | A61N 5/1064 |
| 2020/0129780 A1* | 4/2020 | Lachaine | G16H 20/40 |
| 2020/0311937 A1* | 10/2020 | Wang | G06T 5/50 |
| 2021/0041517 A1* | 2/2021 | Borisch | G01R 33/4835 |
| 2021/0125334 A1* | 4/2021 | Lotter | G06N 3/048 |

* cited by examiner

*Primary Examiner* — Christopher M Brandt
(74) *Attorney, Agent, or Firm* — METIS IP LLC

(57) ABSTRACT

The present disclosure provides systems and methods for processing a 3D image. A method may include for an orientation of the 3D image, obtaining, from the 3D image, a plurality of slices of the orientation; processing the plurality of slices of the orientation by applying a conversion model; and determining a converted 3D image of the orientation based on the plurality of processed slices of the orientation.

19 Claims, 12 Drawing Sheets

SYSTEMS AND METHODS FOR IMAGE PROCESSING

TECHNICAL FIELD

The disclosure generally relates to systems and methods for processing images, and more particularly relates to systems and methods for processing 3D images.

BACKGROUND

Image processing, especially 3D image processing, is widely used. In many cases, it is more convenient, more efficient, and more effective to apply 2D image processing to a 3D image on a slice-by-slice basis. For example, existing techniques for processing a 3D image often employ a neural network trained using 3D sample images. However, such a neural network may be more difficult to train that a network designed to be applied to 2D images, and the training and the use of such neural network usually consumes a large amount of computing resources. Thus, it is desired to provide systems and methods for processing 3D images using reduced computing resources, and potentially improved performance, while achieving good 3D image quality.

SUMMARY

According to a first aspect of the present disclosure, a system for processing a 3D image is provided. The system may include at least one storage device storing executable instructions, and at least one processor in communication with the at least one storage device. When executing the executable instructions, the at least one processor may cause the system to perform one or more of the following operations. The operations may include: for an orientation of the 3D image, obtaining, from the 3D image, a plurality of slices of the orientation; processing the plurality of slices of the orientation by applying a conversion model; and determining a converted 3D image of the orientation based on the plurality of processed slices of the orientation.

In some embodiments, the operations may further include obtaining, based on the plurality of processed slices, at least one second slice of the orientation to be displayed.

In some embodiments, the operations may further include for a second orientation of the 3D image, obtaining, from the 3D image, a plurality of slices of the second orientation; processing the plurality of slices of the second orientation by applying a second conversion model; and determining a converted 3D image of the second orientation based on the plurality of processed slices of the second orientation.

In some embodiments, the operations may further include obtaining, based on the plurality of processed slices of the second orientation, at least one second slice of the second orientation to be displayed.

In some embodiments, the conversion model may be different from the second conversion model.

In some embodiments, the orientation may be different from the second orientation.

In some embodiments, the 3D image may be a cone-beam computed tomography (CBCT) image.

In some embodiments, the conversion model may be obtained by a process including: obtaining a plurality of training samples each of which includes a sample multi-slice computed tomography (MSCT) image and a sample CBCT image; and obtaining the conversion model by training a preliminary model based on the plurality of training samples.

In some embodiments, the preliminary model may be an image style-transfer model.

In some embodiments, the training a preliminary model based on the plurality of training samples may include: for each of the plurality of training samples, obtaining, from the sample CBCT image of the training sample, a plurality of sample CBCT slices of the orientation; obtaining, from the sample MSCT image of the training sample, a plurality of sample MSCT slices of the orientation; and training the preliminary model using the plurality of sample CBCT slices of the orientation as an input and the plurality of sample MSCT slices of the orientation as an expected output.

In some embodiments, for at least one of the plurality of training samples, the sample CBCT image of the training sample may be determined by applying a simulation operation on the sample MSCT image of the training sample.

In some embodiments, the simulation operation may include: transforming the sample MSCT image into at least one 3D array; obtaining projection values of the sample MSCT image by performing a projection algorithm and a noise simulation algorithm on the sample MSCT image based at least in part on the at least one 3D array; and obtaining the sample CBCT image by reconstructing the projection values using a reconstruction algorithm.

In some embodiments, the orientation may be associated with at least one of an axial plane, a coronal plane, or a sagittal plane of the 3D image.

In some embodiments, the conversion model may be a single conversion model used to process slices of a plurality of orientations, and the single conversion model may be obtained by a process including: training a preliminary model using a plurality of sample slices of the plurality of orientations.

In some embodiments, the operations may further include: for a second orientation of the 3D image, obtaining, from the 3D image, a plurality of slices of the second orientation; and obtaining a plurality of processed slices of the second orientation by processing the plurality of slices of the second orientation using the conversion model, the orientation is different from the second orientation.

According to a second aspect of the present disclosure, a method for processing a 3D image is provided. The method may include: for an orientation of the 3D image, obtaining, from the 3D image, a plurality of slices of the orientation; processing the plurality of slices of the orientation by applying a conversion model; and determining a converted 3D image of the orientation based on the plurality of processed slices of the orientation.

According to a third aspect of the present disclosure, a non-transitory readable medium is provided. The non-transitory readable medium may include at least one set of instructions for processing a 3D image. When executed by at least one processor of an electrical device, the at least one set of instructions may direct the at least one processor to perform a method. The method may include: for an orientation of the 3D image, obtaining, from the 3D image, a plurality of slices of the orientation; processing the plurality of slices of the orientation by applying a conversion model; and determining a converted 3D image of the orientation based on the plurality of processed slices of the orientation.

According to a fourth aspect of the present disclosure, a system is provided. The system may include at least one storage device storing executable instructions, and at least one processor in communication with the at least one storage device. When executing the executable instructions, the at least one processor may cause the system to perform one or more of the following operations. The operations may include: identifying, from a plurality of converted 3D images of different orientations, a plurality of second slices corresponding to the different orientations, the plurality of converted 3D image being obtained by processing first slices of the different orientations of a 3D image; and transmitting the plurality of second slices corresponding to different orientations to at least one terminal for display.

In some embodiments, the operations may further include: generating and transmitting to the at least one terminal a notification that the plurality of second slices are obtained from the plurality of converted 3D images each of which is obtained by processing slices of one of the different orientations.

In some embodiments, the plurality of converted 3D images are obtained by: processing the slices of the different orientations by applying a plurality of conversion models, each of the plurality of conversion models corresponding to an orientation of the different orientations; and determining each of the plurality of converted 3D images based on the plurality of processed slices of the corresponding orientation.

In some embodiments, at least two of the plurality of conversion models corresponding to at least two orientations may be different from each other.

In some embodiments, the plurality of converted 3D images are obtained by: processing the slices of the different orientations by applying a conversion model; and determining each of the plurality of converted 3D images based on the plurality of processed slices of the corresponding orientation.

In some embodiments, a visualization of the 3D image along multiple view planes of multiple orientations that intersect at a selected point in the 3D image may be produced by synchronous displaying second slices of the converted 3D images processed along the respective multiple view planes of same or similar orientations.

In some embodiments, the selected point may be interactively selected by a user or may be automatically determined based on a predetermined trajectory.

According to a fifth aspect of the present disclosure, a system is provided. The system may include at least one storage device storing executable instructions, and at least one processor in communication with the at least one storage device. When executing the executable instructions, the at least one processor may cause the system to perform one or more of the following operations. The operations may include: obtaining a MV CBCT image; determining a KV MSCT image by processing slices of the MV CBCT image using a conversion model; and determining a region of interest (ROI) of the KV MSCT image.

In some embodiments, the operations may further include: obtaining a treatment plan, wherein the treatment plan is determined based on the ROI of the KV MSCT image.

In some embodiments, the operations may further include: determining a registration result by registering the KV MSCT image with a planning image; and determining whether to modify the treatment plan based on the registration result.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. The drawings are not scaled. These embodiments are non-limiting exemplary embodiments, in which like reference numerals represent similar structures throughout the several views of the drawings, and wherein.

DETAILED DESCRIPTION

Figure 1:
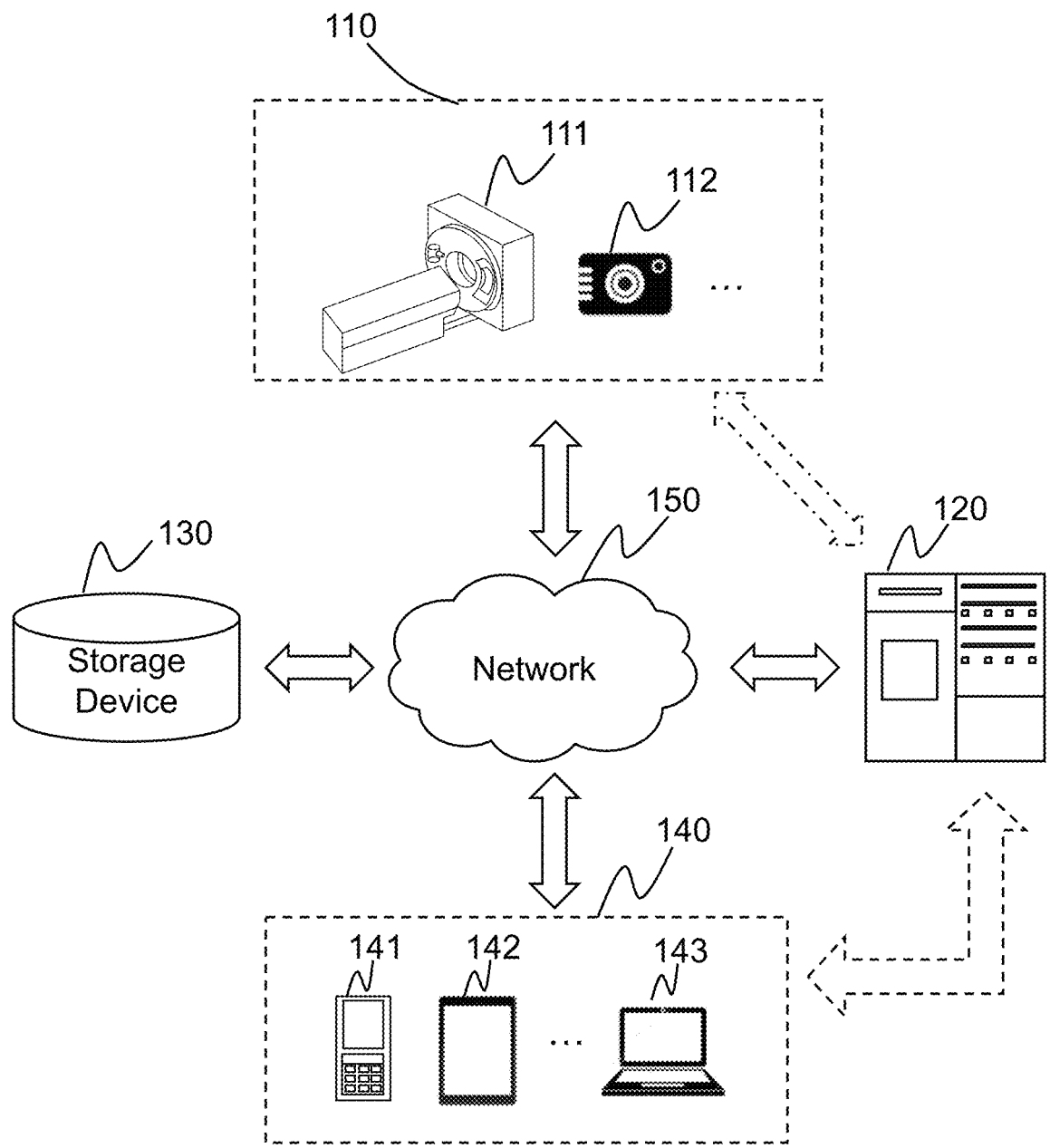
FIG. 1 is a schematic diagram illustrating an exemplary image processing system according to some embodiments of the present disclosure.

The following description is presented to enable any person skilled in the art to make and use the present disclosure and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown but is to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including" when used in this disclosure, specify the presence of stated features, integers, steps, operations, elements, and/or components, but do not preclude the presence or addition of one or more other features, integers, steps, operations, elements, components, and/or groups thereof.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or other storage devices. In some embodiments, a software module/unit/block may be compiled and linked into an executable program. It will be appreciated that software modules can be callable from other modules/units/blocks or themselves, and/or may be invoked in response to detected events or interrupts. Software modules/units/blocks configured for execution on computing devices may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an erasable programmable read-only memory (EPROM). It will be further appreciated that hardware modules/units/blocks may be included in connected logic components, such as gates and flip-flops, and/or can be included of programmable units, such as programmable gate arrays or processors. The modules/units/blocks or computing device functionality described herein may be implemented as software modules/units/blocks but may be represented in hardware or firmware. In general, the modules/units/blocks described herein refer to logical modules/units/blocks that may be combined with other modules/units/blocks or divided into sub-modules/sub-units/sub-blocks despite their physical organization or storage. The description may be applicable to a system, an engine, or a portion thereof.

It will be understood that the term "system," "engine," "unit," "module," and/or "block" used herein are one method to distinguish different components, elements, parts, sections, or assembly of different levels in ascending order. However, the terms may be displaced by another expression if they achieve the same purpose.

It will be understood that when a unit, engine, module or block is referred to as being "on," "connected to," or "coupled to," another unit, engine, module, or block, it may be directly on, connected or coupled to, or communicate with the other unit, engine, module, or block, or an intervening unit, engine, module, or block may be present unless the context clearly indicates otherwise. As used herein, the term "and/or" includes any and all combinations of one or more of the associated listed items.

These and other features, and characteristics of the present disclosure, as well as the methods of operation and functions of the related elements of structure and the combination of parts and economies of manufacture, may become more apparent upon consideration of the following description regarding the accompanying drawings, all of which form a part of this disclosure. It is to be expressly understood, however, that the drawings are for the purpose of illustration and description only and are not intended to limit the scope of the present disclosure. It is understood that the drawings are not to scale.

The flowcharts used in the present disclosure illustrate operations that systems implement according to some embodiments in the present disclosure. It is to be expressly understood, the operations of the flowchart may be implemented not in order. Conversely, the operations may be implemented in an inverted order, or simultaneously. Moreover, one or more other operations may be added to the flowcharts. One or more operations may be removed from the flowcharts.

An aspect of the present disclosure relates to systems and methods for processing a 3D image. The systems and methods may apply a conversion model on slices of an orientation (e.g., an orientation corresponding to an axial plane, a coronal plane, or a sagittal plane) of the 3D image, and obtain a converted 3D image of the orientation based on the processed slices. The systems and methods may use different conversion models to process slices of different orientations. In some embodiments, the model may be configured to generate a 3D image with improved image quality (in terms of desired appearance or task performance) by processing slices of a certain orientation of a 3D image of lower image quality. In some embodiments, the conversion model may be configured to generate a 3D image of a second modality based on a 3D image of a first modality by processing slices of a certain orientation of a 3D image of the first modality in which the first modality and the second modality are different. A conversion model corresponding to an orientation may be trained using 2D sample slices of the orientation of 3D training images. Compared to model training directly using 3D training images, the model training using 2D sample slices as disclosed herein may be easier to converge and consume reduced computing resources. The converted 3D image, or one or more slices thereof, may have improved image quality indicated by, e.g., fewer artifacts, reduced noise, improved appearance, improved contrast, and/or including different or additional information (e.g., available or visible in the converted 3D image of a second modality that is unavailable or invisible in the original 3D image of a first modality), etc., than the original 3D image or the corresponding slice(s).

FIG. 1 is a schematic diagram illustrating an exemplary imaging system 100 according to some embodiments of the present disclosure. The imaging system 100 may include an image acquisition device 110, a processing device 120, a storage device 130, one or more terminals 140, and a network 150. The components in the imaging system 100 may be connected in one or more of various ways. Merely by way of example, the image acquisition device 110 may be connected to the processing device 120 through the network 150. As another example, the image acquisition device 110 may be connected to the processing device 120 directly as illustrated in FIG. 1. As a further example, the terminal(s) 140 may be connected to another component of the imaging system 100 (e.g., the processing device 120) via the network 150. As still a further example, the terminal(s) 140 may be connected to the processing device 120 directly as illustrated by the dotted arrow in FIG. 1. As still a further example, the storage device 130 may be connected to another component of the imaging system 100 (e.g., the processing device 120) directly as illustrated in FIG. 1, or through the network 150.

The image acquisition device 110 may be configured to acquire image data of a subject. The image data of the subject may include an image (e.g., an image slice), projection data, or the like, or a combination thereof. In some embodiments, the image data may be two-dimensional (2D) image data, three-dimensional (3D) image data, four-dimensional (4D) image data (e.g., a series of 3D image data over time), or the like, or any combination thereof. The subject may be biological or non-biological. For example, the subject may include a human, a man-made object, etc., or a portion thereof. In some embodiments, the image acquisition device 110 may include a medical imaging device 111, a camera 112, etc. In some embodiments, the medical imaging device 111 may include a computed tomography (CT) device (e.g., a cone beam CT (CBCT) device, a fan beam CT (FBCT) device, a multi-slice CT (MSCT) device, etc.), a magnetic resonance imaging (MRI) device, an ultrasound imaging device, a fluoroscopy imaging device, a single-photon emission computed tomography (SPECT) device, a positron emission tomography (PET) device, an X-ray imaging device, or the like, or any combination thereof.

Figure 2:
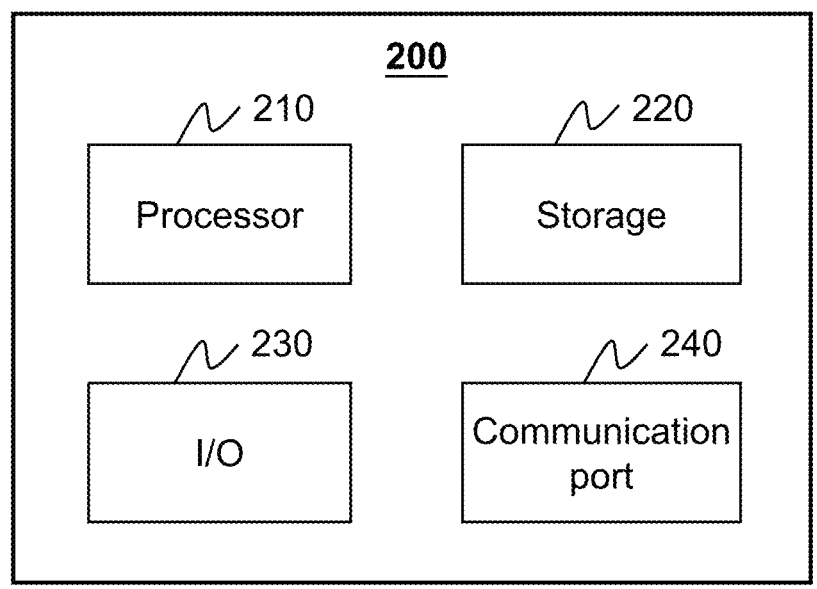
FIG. 2 is a schematic diagram illustrating hardware and/or software components of an exemplary computing device on which the processing device may be implemented according to some embodiments of the present disclosure.

The processing device 120 may process data and/or information obtained from the image acquisition device 110, the terminal(s) 140, and/or the storage device 130. For example, the processing device 120 may obtain 2D image data of a subject from the image acquisition device 110 and reconstruct the 2D image data to obtain a 3D image of the subject. As another example, the processing device 120 may retrieve, from the 3D image along an orientation, a plurality of slices. The processing device 120 may apply a conversion model on the plurality of slices to obtain a plurality of processed slices. The processing device 120 may further determine a converted 3D image of the orientation based on the plurality of processed slices. The processing device 120 may transmit at least one second slice of the converted 3D images to the terminal(s) 140 for display on a display of the terminal(s) 140. In some embodiments, the processing device 120 may be a computer, a user console, a single server or a server group, etc. The server group may be centralized or distributed. In some embodiments, the processing device 120 may be local or remote. For example, the processing device 120 may access information and/or data stored in the image acquisition device 110, the terminal(s) 140, and/or the storage device 130 via the network 150. As another example, the processing device 120 may be directly connected to the image acquisition device 110, the terminal(s) 140, and/or the storage device 130 to access stored information and/or data. In some embodiments, the processing device 120 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof. In some embodiments, the processing device 120 may be implemented by a computing device 200 having one or more components as illustrated in FIG. 2.

The storage device 130 may store data, instructions, and/or any other information. In some embodiments, the storage device 130 may store data obtained from the image acquisition device 110, the terminal(s) 140, and/or the processing device 120. For example, the storage device 130 may store image data acquired by the image acquisition device 110. As another example, the storage device 130 may store conversion model(s) corresponding to various orientation(s). In some embodiments, the storage device 130 may store data and/or instructions that the processing device 120 may execute or use to perform exemplary methods/systems described in the present disclosure. In some embodiments, the storage device 130 may include a mass storage, removable storage, a volatile read-and-write memory, a read-only memory (ROM), or the like, or any combination thereof. Exemplary mass storage may include a magnetic disk, an optical disk, a solid-state drive, etc. Exemplary removable storage may include a flash drive, a floppy disk, an optical disk, a memory card, a zip disk, a magnetic tape, etc. Exemplary volatile read-and-write memories may include a random access memory (RAM). Exemplary RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. Exemplary ROM may include a mask ROM (MROM), a programmable ROM (PROM), an erasable programmable ROM (EPROM), an electrically erasable programmable ROM (EEPROM), a compact disk ROM (CD-ROM), and a digital versatile disk ROM, etc. In some embodiments, the storage device 130 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

In some embodiments, the storage device 130 may be connected to the network 150 to communicate with one or more other components in the imaging system 100 (e.g., the processing device 120, the terminal(s) 140, etc.). One or more components in the imaging system 100 may access the data or instructions stored in the storage device 130 via the network 150. In some embodiments, the storage device 130 may be directly connected to or communicate with one or more other components in the imaging system 100 (e.g., the processing device 120, the terminal(s) 140, etc.). In some embodiments, the storage device 130 may be part of the processing device 120.

The terminal(s) 140 may enable user interaction between a user and the imaging system 100. In some embodiments, the terminal(s) 140 may be connected to and/or communicate with the image acquisition device 110, the processing device 120, the terminal(s) 140, and/or the storage device 130. For example, the terminal(s) 140 may display an image (e.g., a 3D image, a slice of the 3D image, etc.) of the subject obtained from the processing device 120 or the image acquisition device 110. The terminal(s) 140 may include a mobile device 141, a tablet computer 142, a laptop computer 143, or the like, or any combination thereof. In some embodiments, the mobile device 141 may include a smart home device, a wearable device, a mobile device, a virtual reality device, an augmented reality device, or the like, or any combination thereof. In some embodiments, the smart home device may include a smart lighting device, a control device of an intelligent electrical apparatus, a smart monitoring device, a smart television, a smart video camera, an interphone, or the like, or any combination thereof. In some embodiments, the wearable device may include a bracelet, a footgear, eyeglasses, a helmet, a watch, clothing, a backpack, a smart accessory, or the like, or any combination thereof. In some embodiments, the mobile device may include a mobile phone, a personal digital assistant (PDA), a gaming device, a navigation device, a point of sale (POS) device, a laptop, a tablet computer, a desktop, or the like, or any combination thereof. In some embodiments, the virtual reality device and/or the augmented reality device may include a virtual reality helmet, virtual reality glasses, a virtual reality patch, an augmented reality helmet, augmented reality glasses, an augmented reality patch, or the like, or any combination thereof. For example, the virtual reality device and/or the augmented reality device may include a Google Glass™, an Oculus Rift™, a Hololens™, a Gear VR™, etc. In some embodiments, the terminal(s) 140 may be part of the processing device 120.

The network 150 may include any suitable network that can facilitate the exchange of information and/or data for the imaging system 100. In some embodiments, one or more components of the image acquisition device 110 (e.g., an MRI device), the terminal(s) 140, the processing device 120, the storage device 130, etc., may communicate information and/or data with one or more other components of the imaging system 100 via the network 150. For example, the processing device 120 may obtain data from the image acquisition device 110 via the network 150. As another example, the processing device 120 may obtain user instructions from the terminal(s) 140 via the network 150. The network 150 may be and/or include a public network (e.g., the Internet), a private network (e.g., a local area network (LAN), a wide area network (WAN)), etc.), a wired network (e.g., an Ethernet network), a wireless network (e.g., an 802.11 network, a Wi-Fi network, etc.), a cellular network (e.g., a Long Term Evolution (LTE) network), a frame relay network, a virtual private network ("VPN"), a satellite network, a telephone network, routers, hubs, switches, server computers, and/or any combination thereof. Merely by way of example, the network 150 may include a cable network, a wireline network, a fiber-optic network, a telecommunications network, an intranet, a wireless local area network (WLAN), a metropolitan area network (MAN), a public telephone switched network (PSTN), a Bluetooth™ network, a ZigBee™ network, a near field communication (NFC) network, or the like, or any combination thereof. In some embodiments, the network 150 may include one or more network access points. For example, the network 150 may include wired and/or wireless network access points such as base stations and/or internet exchange points through which one or more components of the imaging system 100 may be connected to the network 150 to exchange data and/or information.

It should be noted that the above description of the imaging system 100 is merely provided for illustration, and not intended to limit the scope of the present disclosure. For persons having ordinary skills in the art, multiple variations and modifications may be made under the teachings of the present disclosure. For example, the assembly and/or function of the imaging system 100 may be varied or changed according to specific implementation scenarios.

FIG. 2 is a schematic diagram illustrating hardware and/or software components of an exemplary computing device 200 according to some embodiments of the present disclosure. The computing device 200 may be used to implement any component of the imaging system 100 as described herein. For example, the processing device 120 and/or the terminal(s) 140 may be implemented on the computing device 200, respectively, via its hardware, software program, firmware, or a combination thereof. Although only one such computing device is shown, for convenience, the computer functions relating to the imaging system 100 as described herein may be implemented in a distributed fashion on a number of similar platforms, to distribute the processing load. As illustrated in FIG. 2, the computing device 200 may include a processor 210, a storage 220, an input/output (I/O) 230, and a communication port 240.

The processor 210 may execute computer instructions (program codes) and perform functions of the processing device 120 in accordance with techniques described herein. The computer instructions may include, for example, routines, programs, objects, components, signals, data structures, procedures, modules, and functions, which perform particular functions described herein. For example, the processor 210 may process data obtained from the image acquisition device 110, the terminal(s) 140, the storage device 130, and/or any other component of the imaging system 100. Specifically, the processor 210 may process data obtained from the image acquisition device 110. For example, the processor 210 may generate an image (e.g., a 3D image, a 2D image, etc.) based on the data. In some embodiments, the generated image may be stored in the storage device 130, the storage 220, etc. In some embodiments, the generated image may be displayed on a display screen device by the I/O 230. In some embodiments, the processor 210 may perform instructions obtained from the terminal(s) 140. In some embodiments, the processor 210 may include one or more hardware processors, such as a microcontroller, a microprocessor, a reduced instruction set computer (RISC), an application-specific integrated circuit (ASIC), an application-specific instruction-set processor (ASIP), a central processing unit (CPU), a graphics processing unit (GPU), a physics processing unit (PPU), a microcontroller unit, a digital signal processor (DSP), a field-programmable gate array (FPGA), an advanced RISC machine (ARM), a programmable logic device (PLD), any circuit or processor capable of executing one or more functions, or the like, or any combinations thereof.

Merely for illustration, only one processor is described in the computing device 200. However, it should be noted that the computing device 200 in the present disclosure may also include multiple processors. Thus operations and/or method steps that are performed by one processor as described in the present disclosure may also be jointly or separately performed by the multiple processors. For example, if in the present disclosure the processor of the computing device 200 executes both operation A and operation B, it should be understood that operation A and operation B may also be performed by two or more different processors jointly or separately in the computing device 200 (e.g., a first processor executes operation A and a second processor executes operation B, or the first and second processors jointly execute operations A and B).

The storage 220 may store data/information obtained from the image acquisition device 110, the terminal(s) 140, the storage device 130, or any other component of the imaging system 100. In some embodiments, the storage 220 may include a mass storage device, a removable storage device, a volatile read-and-write memory, a read-only memory (ROM), or the like, or any combination thereof. For example, the mass storage may include a magnetic disk, an optical disk, a solid-state drive, etc. The removable storage may include a flash drive, a floppy disk, an optical disk, a memory card, a zip disk, a magnetic tape, etc. The volatile read-and-write memory may include a random access memory (RAM). The RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. The ROM may include a mask ROM (MROM), a programmable ROM (PROM), an erasable programmable ROM (PEROM), an electrically erasable programmable ROM (EEPROM), a compact disk ROM (CD-ROM), and a digital versatile disk ROM, etc. In some embodiments, the storage 220 may store one or more programs and/or instructions to perform exemplary methods described in the present disclosure.

The I/O 230 may input or output signals, data, and/or information. In some embodiments, the I/O 230 may enable user interaction with the processing device 120. In some embodiments, the I/O 230 may include an input device and an output device. Exemplary input devices may include a keyboard, a mouse, a touch screen, a microphone, or the like, or a combination thereof. Exemplary output devices may include a display device, a loudspeaker, a printer, a projector, or the like, or a combination thereof. Exemplary display devices may include a liquid crystal display (LCD), a light-emitting diode (LED)-based display, a flat panel display, a curved screen, a television device, a cathode ray tube (CRT), or the like, or a combination thereof.

The communication port 240 may be connected with a network (e.g., the network 150) to facilitate data communications. The communication port 240 may establish connections between the processing device 120 and the image acquisition device 110, the terminal(s) 140, or the storage device 130. The connection may be a wired connection, a wireless connection, or a combination of both that enables data transmission and reception. The wired connection may include an electrical cable, an optical cable, a telephone wire, or the like, or any combination thereof. The wireless connection may include a Bluetooth network, a Wi-Fi network, a WiMax network, a WLAN, a ZigBee network, a mobile network (e.g., 3G, 4G, 5G, etc.), or the like, or any combination thereof. In some embodiments, the communication port 240 may be a standardized communication port, such as RS232, RS485, etc. In some embodiments, the communication port 240 may be a specially designed communication port. For example, the communication port 240 may be designed in accordance with the digital imaging and communications in medicine (DICOM) protocol.

Figure 3:
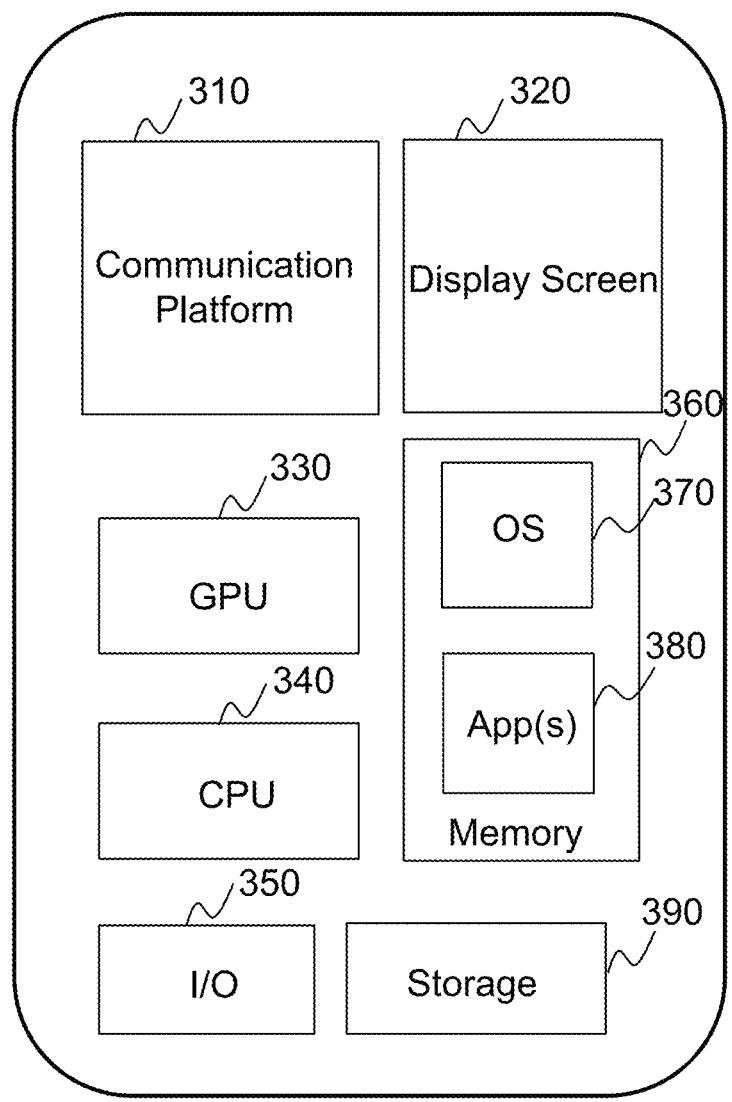
FIG. 3 is a schematic diagram illustrating hardware and/or software components of an exemplary mobile device according to some embodiments of the present disclosure.

FIG. 3 is a schematic diagram illustrating hardware and/or software components of an exemplary mobile device 300 according to some embodiments of the present disclosure. In some embodiments, one or more terminals 140 and/or a processing device 120 may be implemented on a mobile device 300, respectively.

As illustrated in FIG. 3, the mobile device 300 may include a communication platform 310, a display screen 320, a graphics processing unit (GPU) 330, a central processing unit (CPU) 340, an I/O 350, a memory 360, and a storage 390. In some embodiments, any other suitable component, including but not limited to a system bus or a controller (not shown), may also be included in the mobile device 300. In some embodiments, a mobile operating system 370 (e.g., iOS, Android, Windows Phone, etc.) and one or more applications 380 may be loaded into the memory 360 from the storage 390 to be executed by the CPU 340. The applications 380 may include a browser or any other suitable mobile apps for receiving and rendering information relating to image data acquisition or other information from the processing device 120. User interactions with the information stream may be achieved via the I/O 350 and provided to the processing device 120 and/or other components of the imaging system 100 via the network 150.

To implement various modules, units, and functionalities described in the present disclosure, computer hardware platforms may be used as the hardware platform(s) for one or more of the elements described herein. The hardware elements, operating systems and programming languages of such computers are conventional, and it is presumed that those skilled in the art are adequately familiar therewith to adapt those technologies for image data acquisition as described herein. A computer with user interface elements may be used to implement a personal computer (PC) or another type of work station or terminal device, although a computer may also act as a server if appropriately programmed. It is believed that those skilled in the art are familiar with the structure, programming, and general operation of such computer equipment and as a result, the drawings should be self-explanatory.

Figure 4A:
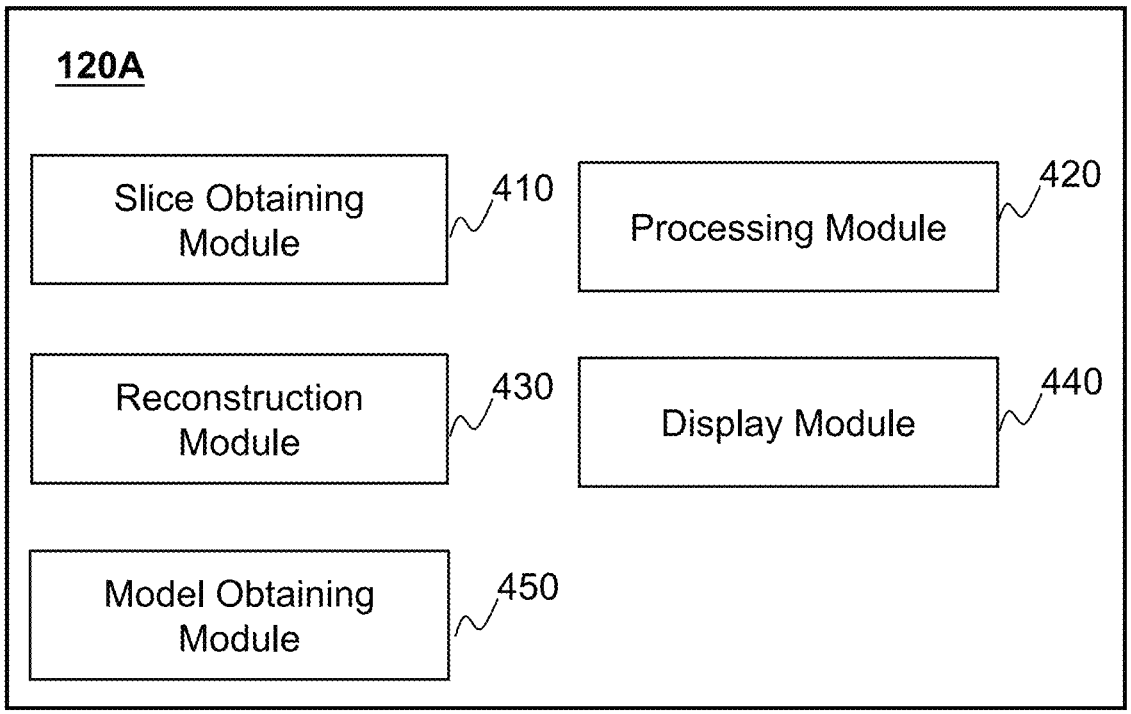
FIG. 4A is a block diagram illustrating an exemplary processing device according to some embodiments of the present disclosure.
Figure 4B:
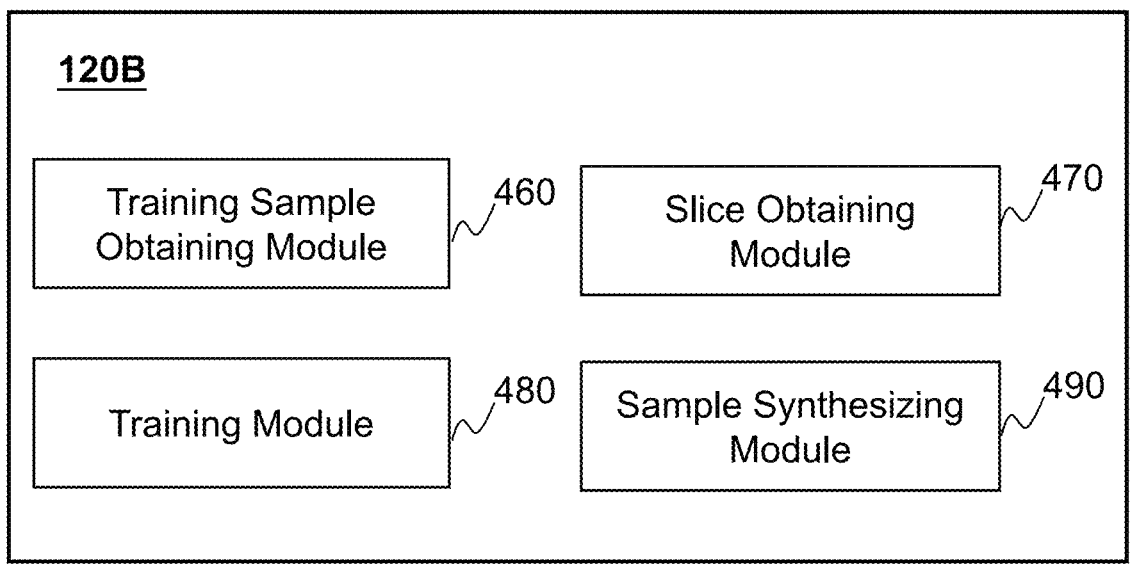
FIG. 4B is a block diagram illustrating an exemplary processing device according to some embodiments of the present disclosure.

FIG. 4A and FIG. 4B are block diagrams illustrating exemplary processing devices 120A and 120B according to some embodiments of the present disclosure. In some embodiments, the processing devices 120A and 120B may be embodiments of the processing device 120 as described in connection with FIG. 1. In some embodiments, the processing devices 120A and 120B may be respectively implemented on a processing unit (e.g., the processor 210 illustrated in FIG. 2 or the CPU 340 as illustrated in FIG. 3). Merely by way of example, the processing devices 120A may be implemented on a CPU 340 of a terminal device, and the processing device 120B may be implemented on a computing device 200. Alternatively, the processing devices 120A and 120B may be implemented on a same computing device 200 or a same CPU 340. For example, the processing devices 120A and 120B may be implemented on a same computing device 200.

As illustrated in FIG. 4A, the processing device 120A may include a slice obtaining module 410, a processing module 420, a reconstruction module 430, a display module 440, and a model obtaining module 450.

The slice obtaining module 410 may be configured to obtain slices (or referred to as first slices) of a 3D image. For example, the slice obtaining module 410 may obtain, from the 3D image, a plurality of slices of an orientation. In some embodiments, the orientation may be any direction in space. The orientation may be defined relative to the 3D image. For example, the orientation may be associated with an axial plane, a coronal plane, a sagittal plane, etc., of the subject represented in the 3D image. For example, the orientation may be a direction parallel to the axial plane, the coronal plane, the sagittal plane, etc., of the 3D image. In some embodiments, the plurality of slices may be 2D images of the 3D image. In some embodiments, the slice obtaining module 410 may retrieve, from the 3D image along the orientation, the plurality of slices. For example, the slice obtaining module 410 may identify a plurality of planes along the orientation of the 3D image and a conversion matrix of each of the plurality of planes. One of the plurality of slices may be obtained based on an array of the 3D image and the conversion matrix of each of the plurality of planes. As another example, the slice obtaining module 410 may obtain, from the 3D image, a plurality of first slices of a second orientation. In some embodiments, the first orientation may be different from the second orientation.

The processing module 420 may be configured to process the slices (or referred to as first slices) obtained from the slice obtaining module 410. For example, the processing module 420 may process the plurality of slices of the orientation using a conversion model. In some embodiments, the conversion model may be a process or an algorithm for processing 2D images. For example, the conversion model may be a deep learning model. In some embodiments, the processing module 420 may input the plurality of slices of the orientation into the conversion model. The output of the conversion model may include a plurality of processed slices of the orientation, each of which corresponds to one of the plurality of input slices of the orientation. As another example, the processing module 420 may process the plurality of second slices of the second orientation using a second conversion model to obtain a plurality of second processed slices of the second orientation. In some embodiments, the second conversion model may be different from the first conversion model.

The reconstruction module 430 may be configured to reconstruct a converted 3D image of the orientation. For example, the reconstruction module 430 may determine the converted 3D image of the orientation based on the plurality of processed slices of the orientation. In some embodiments, the reconstruction module 430 may align the plurality of processed slices of the orientation and stack the aligned slices to obtain the converted 3D image. As another example, the reconstruction module 430 may determine the second converted 3D image of the second orientation based on the plurality of second processed slices of the second orientation.

The display module 440 may be configured to obtain a slice (or referred to as a first slice) of the 3D image (original 3D image) and/or a second slice of the converted 3D image to be displayed. For example, the display module 440 may obtain, from the converted 3D image of the orientation, at least one second slice of the orientation to be displayed. In some embodiments, the display module 440 may obtain the at least one second slice from the converted 3D image based on a user instruction. For example, a user may, via the user terminal 140, select the at least one second slice to be displayed. As another example, a user may select, via the user terminal 140, a target of the subject represented in the converted 3D image (e.g., an organ of the subject in the converted 3D image), and the display module 440 may identify one or more second slices that include a representation of the target as the at least one second slice. In some embodiments, the display module 440 may send the at least one second slice to the terminal(s) 140. The terminal(s) 140 may display the at least one second slice on a user interface (e.g., a display screen) of the terminal(s) 140. As another example, the display module 440 may obtain, from the second converted 3D image of the second orientation, at least one second slice of the second orientation to be displayed.

The model obtaining module 450 may be configured to obtain a trained model. For example, the model obtaining module 450 may obtain a conversion model of the orientation. As another example, the model obtaining module 450 may obtain a second conversion model of the second orientation.

As illustrated in FIG. 4B, the processing device 120B may include a training sample obtaining module 460, a slice obtaining module 470, a training module 480, and a sample synthesizing module 490.

The training sample obtaining module 460 may be configured to obtain training samples. For example, the training sample obtaining module 460 may obtain a plurality of training samples (or referred to as sample image pairs) that are used for training the conversion model (or the second conversion model). A sample image pair may include a sample target image and a corresponding sample input image (e.g., a sample MSCT image as a sample target image and a sample CBCT image as a sample input image) for the model training. A sample image pair may include two corresponding images of different image qualities and/or different modalities. As used herein, two images are considered corresponding to each other if they each include a representation of a same subject, or a same portion thereof.

The slice obtaining module 470 may be configured to obtain sample slices of the training samples. For example, the slice obtaining module 470 may retrieve, from a sample image (e.g., the sample target image, the sample input image) along the orientation, the plurality of sample slices. For example, the slice obtaining module 470 may identify a plurality of planes along the orientation of the sample image and a conversion matrix of each of the plurality of planes. One of the plurality of sample slices may be obtained based on an array of the sample image and the conversion matrix of each of the plurality of planes. Each of at least a portion of the sample slices of the sample input image may correspond to a sample slice of the sample target image.

The training module 480 may be configured to train a preliminary model to obtain the conversion model (or the second conversion model). For example, the training module 480 may train the preliminary model using the plurality of sample slices of the orientation (or the second orientation) of the sample input image and the corresponding sample slices of the orientation (or the second orientation) of the sample target image of each of the plurality of training samples to obtain the conversion model (or the second conversion model). In some embodiments, the conversion model of a first orientation may be trained using sample slices of the first orientation. In some embodiments, the conversion model of a first orientation may be trained using sample slices of one or more second orientations that are different from the first orientation. In some embodiments, the training module 480 may train the preliminary model to obtain a single conversion model using sample slices of a plurality of different orientations. The single conversion model may be used to process slices of any one of the plurality of different orientations. For example, the signal conversion model may be trained using sample slices of a coronal plane, sample slices of an axial plane, and sample slices of a sagittal plane, and be used to process slices of any one of the axial plane, the sagittal plane, and the coronal plane, or slices of any other orientations.

The sample synthesizing module 490 may be configured to synthesize the sample input image based on the sample target image. For example, the sample synthesizing module 490 may transform the sample target image into at least one 3D array, and obtain projection values of the sample target image by performing a projection algorithm and a noise simulation algorithm on the sample target image based at least in part on the at least one 3D array. The sample synthesizing module 490 may determine a synthesized sample image by reconstructing the projection values using a reconstruction algorithm.

It should be noted that the above description is merely provided for the purposes of illustration, and not intended to limit the scope of the present disclosure. Apparently, for persons having ordinary skills in the art, multiple variations and modifications may be conducted under the teachings of the present disclosure. However, those variations and modifications do not depart from the scope of the present disclosure. For example, the processing module 420 and the reconstruction module 430 may be integrated into a single module. As another example, some other components/modules (e.g., a storage module) may be added into and/or omitted from the processing devices 120A and 120B. As still another example, the processing device 120A and the processing device 120B may be integrated into one processing device 120. In some embodiments, the processing device 120A and/or the processing device 120B may share two or more of the modules, and any one of the modules may be divided into two or more units. For instance, the processing devices 120A and 120B may share a same slice obtaining module; that is, the slice obtaining module 410 and the obtaining module 470 are a same module. Each of the modules described above may be a hardware circuit that is designed to perform certain actions, e.g., according to a set of instructions stored in one or more storage media, and/or any combination of the hardware circuit and the one or more storage media.

Figure 5:
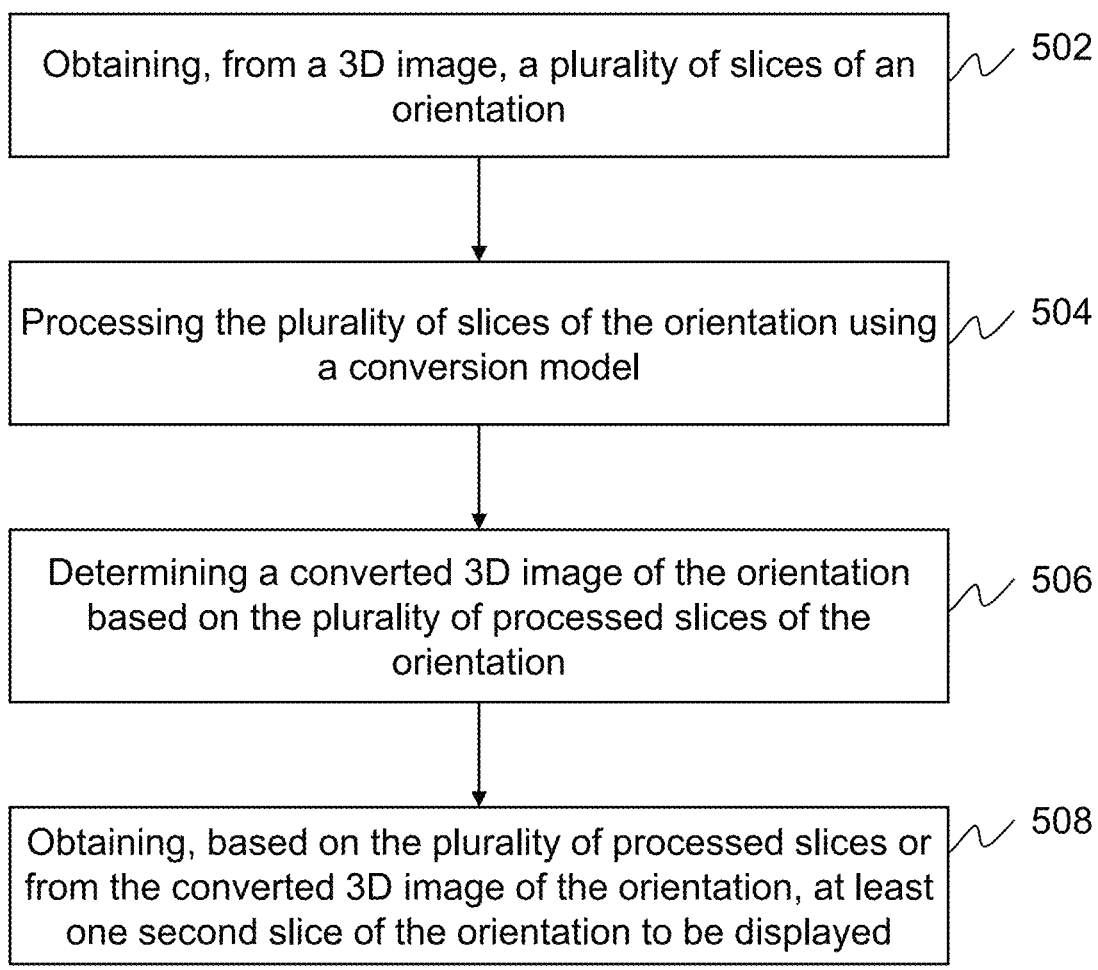
FIG. 5 is a flowchart illustrating an exemplary process for processing a 3D image of a subject according to some embodiments of the present disclosure.

FIG. 5 is a flowchart illustrating an exemplary process 500 for processing a 3D image of a subject according to some embodiments of the present disclosure. In some embodiments, process 500 may be implemented as a set of instructions (e.g., an application) stored in the storage device 130, storage 220, or storage 390. The processing device 120, the processor 210 and/or the CPU 340 may execute the set of instructions, and when executing the instructions, the processing device 120, the processor 210 and/or the CPU 340 may be configured to perform the process 500. The operations of the illustrated process presented below are intended to be illustrative. In some embodiments, the process 500 may be accomplished with one or more additional operations not described and/or without one or more of the operations discussed. Additionally, the order of the operations of the process 500 illustrated in FIG. 5 and described below is not intended to be limiting.

In 502, the processing device 120A (e.g., the slice obtaining module 410) may obtain, from a 3D image, a plurality of slices (or referred to as first slices) of an orientation.

In some embodiments, the 3D image may be directly obtained from the image acquisition device 110. For example, the image acquisition device 110 may include a 3D imaging device to capture the 3D image of a subject, and send the 3D image to the processing device 120A. In some embodiments, the processing device 120A may obtain image data of the subject from the image acquisition device 110. The image data may be reconstructed to obtain the 3D image. In some embodiments, the 3D image may be a 3D medical image. For example, the 3D image may include a CBCT image, an FBCT image, an MSCT image, an MRI image, an ultrasound image, a SPECT image, a PET image, an X-ray image, or the like, or any combination thereof.

In some embodiments, the orientation may be any direction in space. The orientation may be defined relative to the 3D image. For example, the orientation may be associated with an axial plane, a coronal plane, a sagittal plane, etc., of the subject represented in the 3D image. For example, the orientation may be a direction parallel to the axial plane, the coronal plane, the sagittal plane, etc., of the 3D image. In some embodiments, the axial plane may be an imaginary plane that divides the subject (e.g., a human body) into a superior part and an inferior part. In some embodiments, the coronal plane may be an imaginary plane that divides the subject into an anterior part and a posterior part. For example, the subject is a human body, and the coronal plane may divide the human body into a ventral part and a dorsal part. In some embodiments, the sagittal plane may be an imaginary plane that divides the subject (e.g., a human body) into a right part and a left part.

In some embodiments, the plurality of slices (or referred to as first slices) may be 2D images of the 3D image. In some embodiments, the processing device 120A may retrieve, from the 3D image along the orientation, the plurality of slices. For example, the processing device 120A may identify a plurality of planes along the orientation of the 3D image and a conversion matrix of each of the plurality of planes. One of the plurality of slices may be obtained based on an array of the 3D image and the conversion matrix of each of the plurality of planes. In some embodiments, the processing device 120A may identify a target in the 3D image (e.g., a tissue of the human body in the 3D image). The processing device 120A may identify one or more slices that include the target as the plurality of slices.

In 504, the processing device 120A (e.g., the processing module 420) may process the plurality of slices (or referred to as first slices) of the orientation using a conversion model.

In some embodiments, the conversion model may be a process or an algorithm for processing 2D images. In some embodiments, the conversion model may be an image style-transfer model. The image style-transfer model may transfer an image from a first type to a second type (e.g., from a thermal image of the image to an RGB image of the image). In some embodiments, the conversion model may be a deep learning model. For example, the conversion model may include a Convolutional Neural Networks (CNN) model, a Recurrent Neural Network (RNN) model, a Generative Adversarial Network (GAN) model, a CycleGAN model, a pix2pix model, or the like, or any combination thereof.

In some embodiments, the conversion model may be associated with the orientation. The conversion model may be trained using training samples including 2D images (or slices) of the orientation. For example, the orientation is parallel to the coronal plane of the 3D image. The conversion model may be trained using a plurality of training samples. A training sample may include a pair of 3D images corresponding to a same sample subject. Each of the pair of 3D images may include a plurality of 2D images of an orientation, e.g., a plurality of 2D images in the coronal plane. In some embodiments, the conversion model may be associated with a plurality of different orientations. The conversion model may be trained using training samples including 2D images (or slices) of the plurality of different orientations. For example, the training samples may include 2D images of different orientations of the 3D image, e.g., a plurality of 2D images in a coronal plane, a plurality of 2D images in an axial plane, and a plurality of 2D images in a sagittal plane. As another example, a single conversion model may be obtained using sample slices of a plurality of different orientations. The single conversion model may be used to process slices of any one of the plurality of different orientations. More descriptions regarding the training of the conversion model may be found elsewhere in the present disclosure. See, e.g., FIG. 6 and the descriptions thereof.

In some embodiments, the processing device 120A may input the plurality of slices of the orientation into the conversion model. The output of the conversion model may include a plurality of processed slices of the orientation, each of which corresponds to one of the plurality of input slices of the orientation.

In 506, the processing device 120A (e.g., the reconstruction module 430) may determine a converted 3D image of the orientation based on the plurality of processed slices of the orientation.

In some embodiments, the processing device 120A may align the plurality of processed slices of the orientation and stack the aligned slices to obtain the converted 3D image. In some embodiments, the processing device 120A may reconstruct the converted 3D image based on the plurality of processed slices of the orientation. Exemplary reconstruction algorithm may include a stereo corresponding point based technique, a non-stereo corresponding contour method (NCSS), a surface rendering technique, a projective reconstruction technique, an affine reconstruction technique, a Euclidean reconstruction technique, or the like, or any combination thereof.

In 508, the processing device 120A (e.g., the display module 440) may obtain, based on the plurality of processed slices or from the converted 3D image of the orientation, at least one second slice of the orientation to be displayed.

In some embodiments, the processing device 120A may retrieve, from the plurality of processed slices of the converted 3D image of the orientation, one or more second slices for display. That is, the second slices for display are the same as the processed slices. In some embodiments, the processing device 120A may generate a second slice based on one or more processed slices retrieved from the plurality of processed slices of the converted 3D image of the orientation. For example, the processing device 120A may generate a second slice based on one or more of the plurality of processed slices by interpolation, extrapolation, etc.

In some embodiments, the processing device 120A may obtain the at least one second slice from the converted 3D image based on a user instruction. For example, a user may, via the user terminal 140, select the at least one second slice to be displayed. As another example, a user may select, via the user terminal 140, a target of the subject represented in the converted 3D image (e.g., an organ of the subject in the converted 3D image), and the processing device 120A may identify one or more second slices that include a representation of the target as the at least one second slice. In some embodiments, the processing device 120A may send the at least one second slice to the terminal(s) 140. The terminal(s) 140 may display the at least one second slice on a user interface (e.g., a display screen) of the terminal(s) 140.

In some embodiments, the processing device 120A may process the (original) 3D image along a second orientation different from the orientation described in 502-506 of the process 500. For example, for the second orientation, the processing device 120A may obtain, from the 3D image, a plurality of slices of the second orientation. For example, the orientation may be parallel to the sagittal plane, and the second orientation may be parallel to the coronal plane of the 3D image. The processing device 120A may process the plurality of slices of the second orientation by applying a second conversion model. In some embodiments, the second conversion model may be different from the conversion model described in the operation 504. For example, the conversion model in operation 502 may be trained using sample slices of the orientation (e.g., sample slices in the sagittal plane), and the second conversion model may be trained using sample slices of the second orientation (e.g., sample slices in the coronal plane). In some embodiments, the processing device 120A may process the plurality of slices (or referred to as first slices) of the second orientation by applying the conversion model described in operation 504 of the process 500. For example, the plurality of slices in the coronal plane (i.e., the second orientation) may be processed using the conversion model trained using sample slices in the sagittal plane (i.e., the orientation).

To process the (original) 3D model along the second orientation, the plurality of slices of the second orientation may be input into the second conversion model, and the output of the second conversion model may be a plurality of processed slices of the second orientation. The processing device 120A may determine a converted 3D image of the second orientation based on the plurality of processed slices of the second orientation. In some embodiments, the processing device 120A may further obtain, from the converted 3D image of the second orientation, at least one second slice of the second orientation for display.

In some embodiments, the processing device 120A may identify a plurality of different orientations with respect to the 3D image. For each of the plurality of orientations, the processing device 120A may perform operations 502-508 of the process 500. For example, the processing device 120A may identify three orientations, each of which is parallel to the axial plane (a first orientation), the coronal plane (a second orientation), and the sagittal plane (a third orientation) of the (original) 3D image, respectively. The processing device 120A may perform the process 500 on each of the three orientations to obtain a converted 3D image of the first orientation (e.g., in the axial plane), a converted 3D image of the second orientation (e.g., in the coronal plane), and a converted 3D image of the third orientation (e.g., in the sagittal plane).

The processing device 120A may obtain, e.g., from a storage device, the converted 3D image, or a portion thereof, and send to one or more terminal(s) 140 for display. In some embodiments, the received contents may be displayed on multiple terminal(s) 140 simultaneously and synchronously. A change in the displayed contents on one terminal 140 may be reflected on another terminal 140 as well. For instance, a user may provide an instruction to zoom in or out on one terminal 140, the zoom level of the displayed contents on multiple terminals 140 are changed accordingly. In some embodiments, a user may be allowed to specify a change displayed on one terminal 140, or synchronize the displayed contents on multiple terminals 140.

Merely by way of example with reference to the display on one terminal 140, two or more of, e.g., at least one second slice of the orientation, at least one second slice of the second orientation, at least one second slice of the third orientation, may be displayed in different areas on the user interface (e.g., the display screen) of the terminal 140. For example, the user interface may include multiple panels, in each of which at least one second slice of an orientation may be displayed simultaneously and/or synchronously. In some embodiments, the processing device 120A may identify, in each of multiple converted 3D images of different orientations, second slices corresponding to a same target of the subject. The processing device 120A may transmit these second slices of different orientations to the terminal 140 for simultaneous and synchronized display. For instance, two (or three) sets of second slices each in one orientation are simultaneously displayed on the terminal 140; when a user operates on or provides an instructions directed to one set of second slices of one orientation, the set of second slices of the other (or the other two) orientations may change accordingly consistent with the user operation. In some embodiments, on the terminal 140, at least one second slice of different orientations may be displayed sequentially. For example, the terminal 140 may display, on the user interface (e.g., the display screen) of the terminal 140, the at least one second slice of the orientation before the at least one second slice of the second orientation. In some embodiments, the processing device 120A may generate a notification showing that the different sets of second slices for display are obtained from converted 3D images of the different orientations. The converted 3D images of the different orientations are obtained by processing slices of the different orientations of a same 3D image. The processing device 120A may further transmit the notification to a terminal 140. In some embodiments, the second slices and the notification may be displayed on a same terminal 140. In some embodiments, the second slices and the notification may be displayed on at least two different terminals 140. For example, the second slices may be displayed on a first terminal 140, and the notification may be a piece of voice played on a second terminal 140 different from the first terminal 140.

In some embodiments, the orientation of a view plane of a converted 3D image, or a portion thereof, for display may be the same as or similar to the orientation of a view plane along which the plurality of slices of the 3D image are processed to obtain the converted 3D image. For example, a difference between the view plane of the converted 3D image and the view plane along which the corresponding slices are processed to obtain the converted 3D image may be below a predetermined angle threshold (e.g., 3 degrees, 5 degrees, 10 degrees, etc.). As another example, the converted 3D image is obtained based on a plurality of axial slices of the 3D image. The view plane of the converted 3D image for display may be an axial plane of the converted 3D image. In some embodiments, a visualization of the 3D image along multiple view planes of different orientations that intersect at a selected point in the 3D image may be produced by synchronously displaying second slices of the converted 3D images processed along the respective multiple view planes of orientations that are the same as or substantially similar to those different orientations, respectively. For example, when a user wants to view the 3D image along an axial plane, a coronal plane, and a sagittal plane of the 3D image, synchronously, a point in the 3D image is selected. An axial plane of an axial converted 3D image, a coronal plane of a coronal converted 3D image, and a sagittal plane of a sagittal converted 3D image that intersect at the selected point may be identified. Axial second slice(s) of the axial plane of the axial converted 3D image, coronal second slice(s) of the coronal plane of the coronal converted 3D image, and sagittal second slice(s) of the sagittal plane of the sagittal converted 3D image may be displayed, synchronously. In some embodiments, the selected point may be interactively selected by a user. In some embodiments, the selected point may be automatically determined based on a predetermined trajectory. For example, the predetermined trajectory may be traversed the target (or the 3D image) in an automated way. The selected point may be any point on the predetermined trajectory.

In some embodiments, a procedure of navigation of a converted 3D image corresponding to one or more orientations via 2D views may be substantially identical to a procedure of navigation of the original 3D image (from which the converted 3D image is generated) via 2D views. For example, the original 3D image (or referred to as the 3D image for brevity) of a human body is shown on user interface(s) of the terminal(s) 140 by displaying a slice of an axial plane, a slice of a coronal plane, and a slice of a sagittal plane of the 3D image. The three planes intersect at a selected point. During the navigation of the 3D image, the selected point may move along the axial direction (or along an intersection line of the coronal plane and the sagittal plane), thereby slices along the axial direction from the head to the toes of the human body may be displayed as the selected point moves. The slice of the coronal plane and the slice of the sagittal plane of the 3D image may remain the same during the navigation. Similarly, the converted 3D images (obtained by processing slices of the 3D image) may be navigated from one or more orientations via 2D views in an identical way. For example, an axial converted 3D image (obtained by processing axial slices of the 3D image), a coronal converted 3D image (obtained by processing coronal slices of the 3D image), and a sagittal converted 3D image (obtained by processing sagittal slices of the 3D image) of the human body may be shown on user interface(s) of the terminal(s) 140 by displaying an axial second slice along an axial plane of the axial converted 3D image, a coronal second slice along a coronal plane of the coronal converted 3D image, and a sagittal second slice along a sagittal plane of the sagittal converted 3D image. The axial plane, the coronal plane, and the sagittal plane may intersect at a selected point. During the navigation of the converted 3D images, the selected point may move along the axial direction of the axial converted 3D image (or along an intersection line of the coronal plane of the coronal converted 3D image and the sagittal plane of the sagittal converted 3D image), thereby second slices along the axial direction of the axial converted 3D image from the head to the toes of the human body may be displayed as the selected point moves. The second slice of the coronal plane of the coronal converted 3D image and the second slice of the sagittal plane of the sagittal converted 3D image may remain the same during the navigation. It should be noted that the above procedures of navigation along the axial direction are only described for illustration purpose, the 3D image and/or the converted 3D images may be navigated in any known ways.

In some embodiments, a procedure of navigation via 2D views of a converted 3D image obtained by 2D operations as disclosed herein may be substantially identical to a procedure of navigation of a converted 3D image obtained via 3D operations. As used herein, a 3D operation of a 3D image refers to conversion of the 3D image using a conversion model that operates directly on the 3D image, instead of 2D slices of an orientation of the 3D image according to embodiments of the present disclosure. Such a conversion model used in a 3D operation may be trained directly using 3D training images, instead of using 2D slices of an orientation of 3D training images according to embodiments of the present disclosure.

It should be noted that the above description is merely provided for illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, one or more operations may be omitted and/or one or more additional operations may be added. For example, one or more other optional operations (e.g., a storing operation) may be added elsewhere in the process 500. In some embodiments, the processing device 120A may store a converted 3D image (e.g., the converted 3D image of the orientation, the converted 3D image of the second orientation, the converted 3D image of the third orientation), or a portion thereof (e.g., at least one second slice of the orientation, at least one second slice of the second orientation, at least one second slice of the third orientation) in a storage device (e.g., the storage device 130, the storage 220, the storage 390, etc.) of the imaging system 100.

Merely by way of example, a 3D CBCT image acquired by a CBCT device (the image acquisition device 110) is processed according to methods disclosed herein. The CBCT image may have an inferior image quality than an MSCT image acquired by an MSCT device in terms of contrast, contrast-to-noise ratio, resolution, etc. For example, a bone may be represented in an MSCT image with a much higher contrast owing to a high mean atomic number of the bone (in turn, owing to the calcium content of the bone) than in a CBCT image. As another example, a scatter and a beam hardening of the CBCT device may degrade the image quality of the CBCT image.

In some embodiments, a megavoltage (MV) CBCT image may be processed according to the methods disclosed herein to obtain a kilovoltage (KV) MSCT image. For example, the conversion model may be trained using sample image pairs. Each of the sample image pairs may include a sample MV CBCT image and a corresponding sample KV MSCT image. An MV CBCT image (or referred to as the 3D image) acquired by a CBCT device (the image acquisition device 110) may be processed using the conversion model according to methods disclosed herein. For example, slices of the MV CBCT image may be obtained and processed using the conversion model to obtain processed slices. A KV MSCT image (or referred to as the converted 3D image) corresponding to the MV CBCT image may be determined based on the processed slice. In some embodiments, the KV MSCT image may be used to facilitate treatment of a subject in a radiation therapy process (e.g., an adaptive radiation therapy (ART) process). For example, after obtaining the KV MSCT image, a region of interest (ROI) of the KV MSCT image may be determined by contouring the ROI on the KV MSCT image. A treatment plan for treating the subject may be determined based on the contoured ROI on the KV MSCT image by a physician or the processing device 120A. In some embodiments, before the radiation therapy process of the subject, a planning image may be acquired. The planning image may be used to identify and locate one or more radiation targets of the subject. A registration result may be determined by registering the KV MSCT image with the planning image. The registration result may be used to determine a difference between the KV MSCT image and the planning image, and further to optimize the treatment plan. For example, the processing device 120A may determine whether to modify the treatment plan based on the registration result. A modified treatment plan may be implemented on the subject. In some embodiments, a DRR (Digital Reconstructed Radiography) image may be generated by simulating a projection on the KV MSCT image. And a 2D image may be acquired by a detector of a CBCT device (e.g. a EPID of a radiotherapy device) during the radiation therapy process. A registration result between the DRR image and the 2D image may be determined, and further be used to determine whether to modify the treatment plan or adjusting the machine parameters. Thereby, the treatment plan may be optimized during the radiation therapy process.

In some embodiments, a conversion model may be trained for processing slices of the CBCT image to generate a converted 3D image closely resembling an MSCT image. For example, the conversion model may be obtained by training a preliminary model using a plurality of MSCT-CBCT image pairs. The preliminary model may be a deep learning model. For example, the preliminary model may include a Convolutional Neural Networks (CNN) model, a Recurrent Neural Network (RNN) model, a Generative Adversarial Network (GAN) model, a CycleGAN model, a pix2pix model, or the like, or any combination thereof. In some embodiments, the conversion model may be trained to improve the image quality of a CBCT image by reducing the effects caused by, e.g., the scatter and the beam hardening of the CBCT device, reducing image degradation noise, improving contrast, signal-to-noise ratio, resolution, or the like, or a combination thereof. Exemplary processes for obtaining the conversion model may be found elsewhere (e.g., FIGS. 6-7 and the descriptions thereof) of the present disclosure.

In some embodiments, the processing device 120A may identify an orientation of the CBCT image. The processing device 120A may obtain, from the CBCT image, a plurality of slices of the orientation, and apply the conversion model of the orientation to the plurality of slices. For example, the input of the conversion model may include the plurality of slices, and the output of the conversion model may include a plurality of processed slices of the orientation, each of which corresponds to one of the plurality of slices. The processing device 120A may further generate a converted CBCT image based on the plurality of processed slices. One or more second slices of the converted CBCT image of the orientation may be displayed on the terminal(s) 140.

In some embodiments, the processing device 120A may process the CBCT image using different conversion models of different orientations. For example, for each orientation parallel to an axial plane, a coronal plane, and a sagittal plane, respectively, the processing device 120A may obtain a plurality of axial slices, a plurality of coronal slices, and a plurality of sagittal slices. In some embodiments, the plurality of axial slices, the plurality of coronal slices, and the plurality of sagittal slices may be input into an axial conversion model, a coronal conversion model, and a sagittal conversion model, respectively, to obtain a plurality of processed axial slices, a plurality of processed coronal slices, and a plurality of processed sagittal slices. The plurality of processed axial slices, the plurality of processed coronal slices, and the plurality of processed sagittal slices may be processed to generate a converted axial CBCT image, a converted coronal CBCT image, and a converted sagittal CBCT image, respectively. In some embodiments, the processing device 120A may obtain at least one second axial slice of the axial converted axial CBCT image, at least one second coronal slice of the converted coronal CBCT image, and/or at least one second sagittal slice of the converted sagittal CBCT image to be displayed. For example, on a user interface of the terminal(s) 140, a second axial slice, a second coronal slice, and a second sagittal slice may be displayed simultaneously in three separate panels. As another example, the terminal(s) 140 may display on the user interface only one or two of the second axial slice, the second coronal slice, and the second sagittal slice at a time. Alternatively, all of the plurality of axial slices, the plurality of coronal slices, and the plurality of sagittal slices may be input into the axial conversion model (or the coronal conversion model, or the sagittal conversion model) to obtain a plurality of processed axial slices, a plurality of processed coronal slices, and a plurality of processed sagittal slices.

In some embodiments, the axial conversion model may be trained using a plurality of sample axial MSCT-CBCT image pairs. A sample axial MSCT-CBCT image pair may include sample axial MSCT slices and corresponding sample axial CBCT slices. The coronal conversion model may be trained using a plurality of sample coronal MSCT-CBCT image pairs. A sample coronal MSCT-CBCT image pair may include sample coronal MSCT slices and corresponding sample coronal CBCT slices. The sagittal conversion model may be trained using a plurality of sample sagittal MSCT-CBCT image pairs. A sample sagittal MSCT-CBCT image pair may include sample sagittal MSCT slices and sample sagittal CBCT slices.

Figure 6:
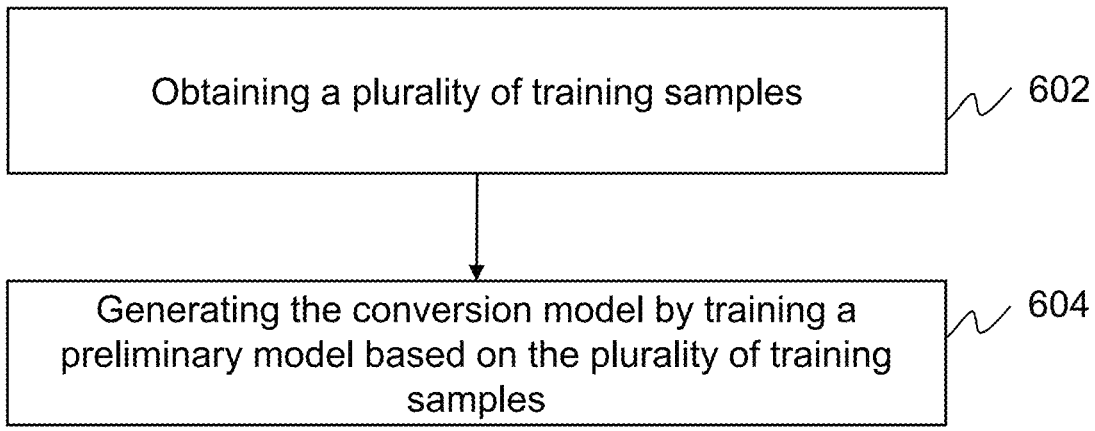
FIG. 6 is a flowchart illustrating an exemplary process for generating a conversion model of an orientation according to some embodiments of the present disclosure.

FIG. 6 is a flowchart illustrating an exemplary process 600 for generating a conversion model of an orientation according to some embodiments of the present disclosure. In some embodiments, the process 600 may be implemented as a set of instructions (e.g., an application) stored in the storage device 130, storage 220, or storage 390. The processing device 120, the processor 210 and/or the CPU 340 may execute the set of instructions, and when executing the instructions, the processing device 120, the processor 210 and/or the CPU 340 may be configured to perform the process 600. The operations of the illustrated process presented below are intended to be illustrative. In some embodiments, the process 600 may be accomplished with one or more additional operations not described and/or without one or more of the operations discussed. Additionally, the order of the operations of process 600 illustrated in FIG. 6 and described below is not intended to be limiting.

In some embodiments, the conversion model of the orientation may be trained offline. For example, the conversion model may be trained and stored in a storage device (e.g., the storage device 130, the storage 220, the storage 390, etc.) of the imaging system 100. The processing device 120A may access the storage device to retrieve the conversion model for processing a 3D image. Alternatively, the conversion model may be trained in real-time. For example, the processing device 120B may train the conversion model before using the conversion model.

In 602, the processing device 120B (e.g., the training sample obtaining module 460) may obtain a plurality of training samples (or referred to as sample image pairs). A sample image pair may include a sample target image and a corresponding sample input image (e.g., a sample MSCT image as a sample target image and a sample CBCT image as a sample input image) for the model training. A sample image pair may include two corresponding images of different image qualities and/or different modalities. As used herein, two images are considered corresponding to each other if they each include a representation of a same subject, or a same portion thereof. Merely by way of example, a first 3D image of the sample image pair may have a lower image quality and/or be of a first modality; a second 3D image of the sample image pair may have a higher image quality and/or be of a second modality. The first 3D image may include a plurality of first 2D images to be used as an input in training the conversion model. The second 3D image may include a plurality of second 2D images to be used as an expected output in training the conversion model.

Merely by way of example, the plurality of training samples may include a plurality of sample MSCT images and a plurality of corresponding sample CBCT images. In some embodiments, at least one sample image may be acquired by a prior scan using an imaging device (e.g., an MSCT device, a CBCT device). Various sample images may be acquired using a same imaging device or different imaging devices. For instance, various sample MSCT images may be acquired using different MSCT devices. In some embodiments, at least one sample image may be synthetized based on an image obtained from a prior scan. In some embodiments, based on a sample target image, one or more sample input images may be synthesized. Merely by way of example, based on a sample MSCT image obtained by a prior scan, one or more sample CBCT images may be synthesized according to a simulation operation. A sample CBCT image may be obtained by applying the simulation operation on the sample MSCT image, and the synthesized sample CBCT image and the sample MSCT image may form a training sample. An exemplary process of a simulation operation may be found elsewhere (e.g., FIG. 7 and the descriptions thereof) in the present disclosure. In some embodiments, the plurality of training samples may be predetermined and stored in a storage device (e.g., the storage device 130, the storage 220, the storage 390, etc.) of the imaging system 100. The processing device 120B may access the storage device to obtain the plurality of training samples.

In 604, the processing device 120B (e.g., the training module 480) may generate the conversion model by training a preliminary model based on the plurality of training samples.

In some embodiments, the preliminary model may be a process or an algorithm. In some embodiments, the preliminary model may be a deep learning model. For example, the preliminary model may include a Convolutional Neural Networks (CNN) model, a Recurrent Neural Network (RNN) model, a Generative Adversarial Network (GAN) model, a CycleGAN model, a pix2pix model, or the like, or any combination thereof. In some embodiments, the preliminary model may be used for processing 2D or 3D images. For example, the preliminary model may be a process or an algorithm for processing 3D images. The plurality of training samples may be used directly to train the preliminary model, thereby obtaining the conversion model for processing 3D images. As another example, the preliminary model may be a process or an algorithm for processing 2D images. The plurality of training samples may be processed to obtain sample slices of the plurality of training samples. The sample slices of the plurality of training samples may be used to train the preliminary model, thereby determining the conversion model for processing 2D slices of 3D images. For each of the plurality of training samples, the training module 480 may obtain from the sample input image of the training sample, a plurality of sample slices of the orientation.

In some embodiments, the slice obtaining module 470 may retrieve, from a sample image (e.g., the sample target image, the sample input image) along the orientation, the plurality of sample slices. For example, the slice obtaining module 470 may identify a plurality of planes along the orientation of the sample image and a conversion matrix of each of the plurality of planes. One of the plurality of sample slices may be obtained based on an array of the sample image and the conversion matrix of each of the plurality of planes. Each of at least a portion of the sample slices of the sample input image may correspond to a sample slice of the sample target image.

Merely by way of example, the sample input image is a CBCT image, and the sample target image is an MSCT image. The sample CBCT image and the sample MSCT image may be processed according to a same way (e.g., according to a same thickness interval along the orientation) to obtain the plurality of sample CBCT slices and the plurality of sample MSCT slices. Each of at least a portion of the plurality of sample CBCT slices may correspond to one of the plurality of sample MSCT slices in a one-to-one relationship.

In some embodiments, the training module 480 may train the preliminary model using the plurality of sample slices of the orientation of the sample input image and the corresponding sample slices of the orientation of the sample target image of each of the plurality of training samples. In some embodiments, the conversion model of a first orientation may be trained using sample slices of one or more second orientations that are different from the first orientation. For example, the conversion model of the orientation of the coronal plane of a subject may be trained using samples slices in the sagittal plane of sample subjects of a plurality of training samples. A training sample may include a pair of 3D images, one of which includes a plurality of first 2D images in the sagittal plane of a sample subject as an input in training the conversion model, and the other of which includes a plurality of first 2D images in the sagittal plane of the sample subject as an expected output in training the conversion model.

In some embodiments, the preliminary model may include a plurality of layers, each of which includes a plurality of parameters. In some embodiments, the plurality of layers may be determined in parallel during the training process of the preliminary model. For example, the training module 480 may determine the plurality of layers by iteratively and jointly updating parameters of each layer of the preliminary model based on the plurality of training samples. Alternatively, the plurality of layers may be sequentially determined during the training of the preliminary model in which the training of a specific layer is performed only after all the layers upstream to the specific layer are finished. For example, a layer $M_i$ (i being greater than 1) of the preliminary model may be determined based on the training samples and the determined layers $M_1$ to $M_{i-1}$ that are determined before the determining of the layer $M_i$.

In some embodiments, the training module 480 may terminate the training process to obtain the conversion model if a termination condition is satisfied. For example, the termination condition may be deemed satisfied if a value of a loss function is minimal or smaller than a threshold (e.g., a constant). The loss function may be determined to measure a difference between an output slice obtained by inputting a sample input slice into the preliminary model (during the training process) and a sample target slice corresponding to the sample input slice. As another example, the termination condition may be deemed satisfied if the value of the loss function converges. In some embodiments, convergence may be deemed to have occurred if, for example, the variation of values of loss functions in two or more consecutive iterations is equal to or smaller than a threshold (e.g., a constant). As still another example, the termination condition may be deemed satisfied if a certain count of iterations that have been performed. As a further example, the termination condition may be deemed satisfied if a certain count of the plurality of training samples that have been used.

In some embodiments, when the number (or count) of new training samples exceeds a count threshold, the updating of the conversion model may be triggered such that the new training samples may be used to optimize the conversion model. Alternatively, the conversion model may be updated in response to receiving a user input relating to optimizing the conversion model.

In some embodiments, after the conversion model is determined, the conversion model may be tested to determine whether the conversion model satisfies a predetermined condition. For example, one or more test samples each of which includes a test input image and a test target image may be used for testing or verifying the conversion model. For instance, for a conversion model trained using CBCT images and corresponding MSCT images, the plurality of test samples may also include pairs of CBCT images and corresponding MSCT images.

In some embodiments, at least one test image of the plurality of test samples may be acquired by a prior scan using an imaging device. In some embodiments, at least one test image of the plurality of test samples may be synthesized. The test samples may be obtained similarly to the training samples as described in connection with 602, the descriptions of which are not repeated here. In some embodiments, some training samples may be designated as the test samples used for testing a determined conversion model.

In some embodiments, for a test sample including a test input image and a test target image, the plurality of slices of the orientation of the test input image may be input into the conversion model to obtain a plurality of output slices. A difference between each of the plurality of output slices and the corresponding slices of the test target image of the test sample may be determined and compared with a threshold. If the difference exceeds the threshold, the conversion model may be deemed unsatisfactory or not satisfying the predetermined condition, and the conversion model may need to be trained further. If the difference is below the threshold, the conversion model may be deemed satisfactory or satisfying the predetermined condition, and the conversion model may be used for processing the 3D image.

It should be noted that the above description is merely provided for illustration, and not intended to limit the scope of the present disclosure. For persons having ordinary skills in the art, multiple variations and modifications may be made under the teachings of the present disclosure. However, those variations and modifications do not depart from the scope of the present disclosure. For example, one or more other optional operations (e.g., a storing operation) may be added in the process 600. The processing device 120 may store information and/or data (e.g., the sample input images and/or the slices thereof, the sample target images and/or the slices thereof, the test input images and/or the slices thereof, the test target image and/or the slices thereof, etc.) in a storage device (e.g., the storage device 130, the storage 220, the storage 390, etc.) of the imaging system 100.

Figure 7:
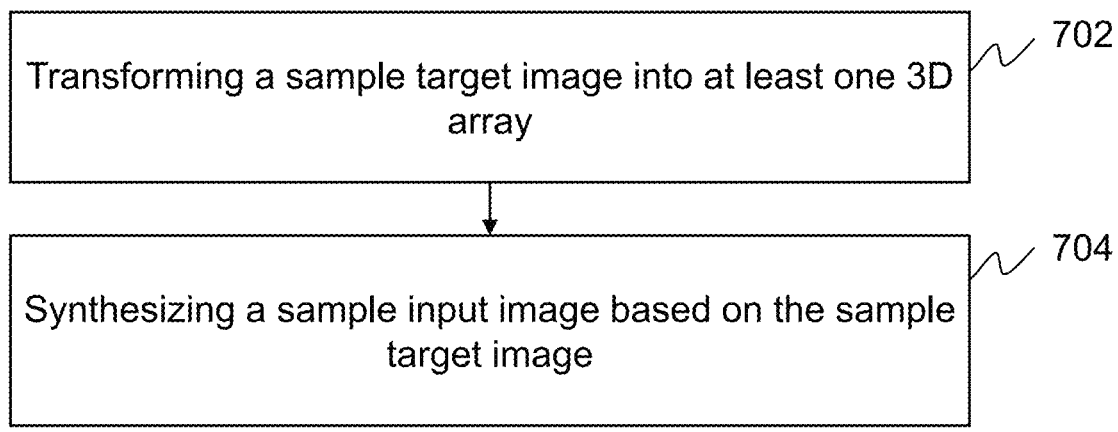
FIG. 7 is a flowchart illustrating an exemplary of a simulation operation according to some embodiments of the present disclosure.

FIG. 7 is a flowchart illustrating an exemplary process of a simulation operation according to some embodiments of the present disclosure. In some embodiments, process 700 may be implemented as a set of instructions (e.g., an application) stored in the storage device 130, storage 220, or storage 390. The processing device 120, the processor 210 and/or the CPU 340 may execute the set of instructions, and when executing the instructions, the processing device 120, the processor 210 and/or the CPU 340 may be configured to perform the process 700.

The operations of the illustrated process presented below are intended to be illustrative. In some embodiments, the process 700 may be accomplished with one or more additional operations not described and/or without one or more of the operations discussed. Additionally, the order of the operations of process 700 illustrated in FIG. 7 and described below is not intended to be limiting. In some embodiments, for a training sample of the plurality of training samples, a sample input image may be determined by applying the process 700 on a corresponding sample target image.

In 702, the processing device 120B (e.g., the sample synthesizing module 490) may transform a sample target image into at least one 3D array. In some embodiments, a 3D array may represent a physical composition in the sample target image. For example, the 3D array may reflect a tissue type (e.g., a bone, soft tissue, the air, etc.), a density of the tissue in the sample target image, etc. In some embodiments, the sample target image may be converted into a 3D array representing a tissue distribution (e.g., the distribution of bone tissue, soft tissue, the air, etc.), a 3D array of density distribution, or the like, or any combination thereof.

In 704, the sample synthesizing module 490 may synthesize a sample input image based on the sample target image. For instance, the sample target image is a sample MSCT image. Projection values of the sample MSCT image may be obtained by performing a projection algorithm and a noise simulation algorithm on the sample MSCT image based at least in part on the at least one 3D array.

In some embodiments, a forward projection polychromatic raytracer may be performed on the at least one 3D array over multiple projection angles using a CBCT spectrum/phase space as a beam to obtain at least one projected 2D array. For example, an MV-level spectrum/phase space may be used as a beam to perform on the at least one 3D array of a sample MSCT image to obtain an MV-level sample CBCT image. As another example, a KV-level spectrum/phase space may be used as a beam to perform on the at least one 3D array of a sample MSCT image to obtain a KV-level sample CBCT image. In some embodiments, after the forward projection polychromatic raytracer algorithm is performed, an electronic noise simulation algorithm or a quantum noise simulation algorithm may be performed on the at least one projected 2D array to obtain the projection values of the sample MSCT image. For example, a Poisson/Gaussian noise (using random number generator) may be added to the at least one projected 2D array to obtain the projection values. In some embodiments, a detector energy response model and/or a detector optical model may be applied on the projection value to simulate the energy and/or optical signals detected by the detector of a CBCT device.

The sample synthesizing module 490 may determine a synthesized sample CBCT image by reconstructing the projection values using a reconstruction algorithm. In some embodiments, the projection values may be reconstructed using a similar reconstruction algorithm to that used in a CBCT device. For example, the reconstruction algorithm may include an FDK algorithm, a variable FDK algorithm (V-FDK algorithm), an FDK-FAST algorithm, a curve-filtered FDK (C-FDK) algorithm, or the like, or any combination thereof.

It should be noted that the above description is merely provided for illustration, and not intended to limit the scope of the present disclosure. For persons having ordinary skills in the art, multiple variations and modifications may be made under the teachings of the present disclosure. However, those variations and modifications do not depart from the scope of the present disclosure. For example, one or more other optional operations (e.g., a storing operation) may be added elsewhere in the process 700. The processing device 120 may store information and/or data (e.g., the sample target image) in a storage device (e.g., the storage device 130, the storage 220, the storage 390, etc.) of the imaging system 100.

EXAMPLES

The following examples are provided for illustration purposes and not intended to be limiting.

The preliminary model is a pix2pix model. A first conversion model of a first orientation was obtained by training the pix2pix model using training samples. A training sample includes a sample CBCT image as a sample input image and a sample MSCT image as a sample target image. Each of the sample CBCT image and the sample MSCT image of a training sample for training the first conversion model includes slices of the first orientation parallel to an axial plane.

A second conversion model of a second orientation was obtained by training the pix2pix model using training samples. A training sample includes a sample CBCT image as a sample input image and a sample MSCT image as a sample target image. Each of the sample CBCT image and the sample MSCT image of a training sample for training the second conversion model includes slices of the second orientation parallel to a sagittal plane.

A third conversion model of a third orientation was obtained by training the pix2pix model using training samples. A training sample includes a sample CBCT image as a sample input image and a sample MSCT image as a sample target image. Each of the sample CBCT image and the sample MSCT image of a training sample for training the third conversion model includes slices of the third orientation parallel to a coronal plane.

An MSCT device scanned the abdomen of a sample subject to obtain a test MSCT image. The test MSCT image was sliced along the first, second, and third orientations to obtain a plurality of test slices and used to test the first conversion model of the first orientation, the second conversion model of the second orientation, and the third conversion model of the third orientation that were so determined. The first conversion model of the first orientation, the second conversion model of the second orientation, and the third conversion model of the third orientation were used in image processing the results of which are shown in FIGS. 14-19.

Figure 8:
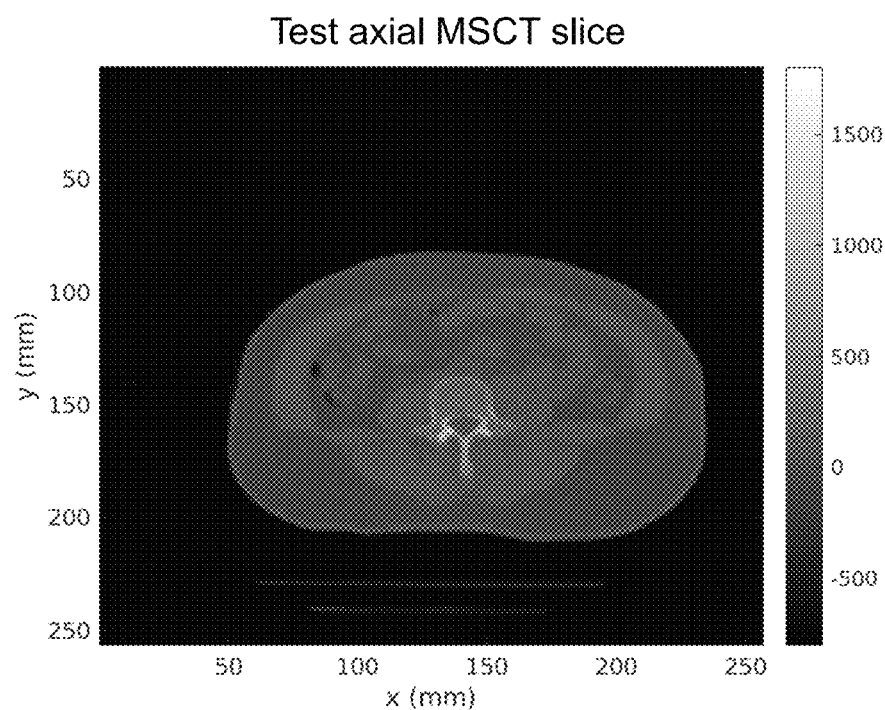
FIG. 8 is a schematic diagram illustrating an exemplary test axial MSCT slice according to some embodiments of the present disclosure.
Figure 9:
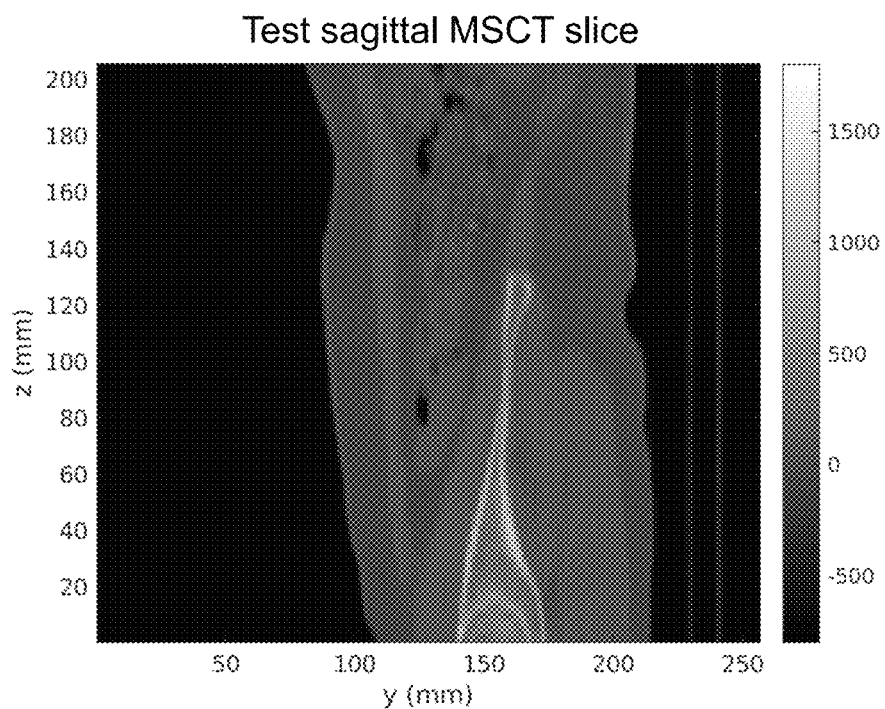
FIG. 9 is a schematic diagram illustrating an exemplary test sagittal MSCT slice according to some embodiments of the present disclosure.
Figure 10:
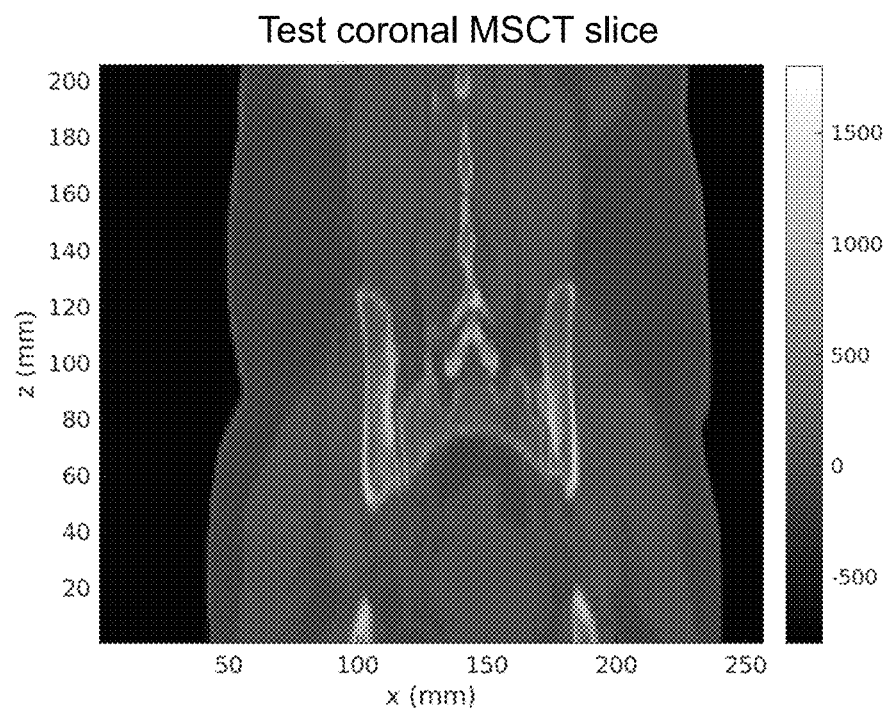
FIG. 10 is a schematic diagram illustrating an exemplary test coronal MSCT slice according to some embodiments of the present disclosure.

FIG. 8 is a schematic diagram illustrating an exemplary test axial MSCT slice according to some embodiments of the present disclosure. The test axial MSCT slice was obtained from the test MSCT image along the first orientation parallel to the axial plane of the test MSCT image. FIG. 9 is a schematic diagram illustrating an exemplary test sagittal MSCT slice according to some embodiments of the present disclosure. The test sagittal MSCT slice was obtained from the test MSCT image along the second orientation parallel to the sagittal plane of the test MSCT image. FIG. 10 is a schematic diagram illustrating an exemplary test coronal MSCT slice according to some embodiments of the present disclosure. The test coronal MSCT slice was obtained from the test MSCT image along the third orientation parallel to the coronal plane of the test MSCT image.

Figure 11:
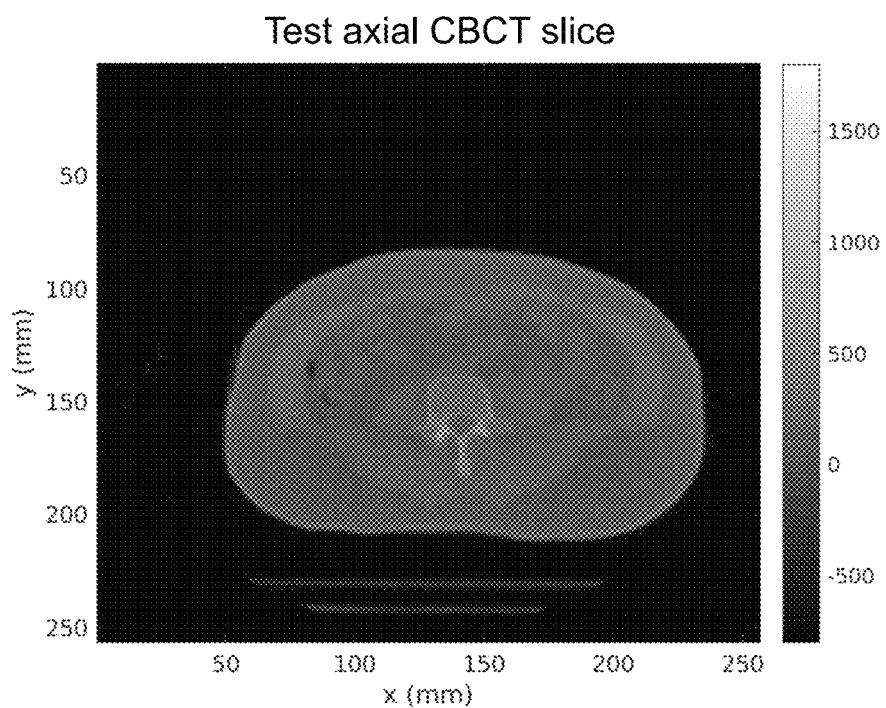
FIG. 11 is a schematic diagram illustrating an exemplary test axial CBCT slice according to some embodiments of the present disclosure.
Figure 12:
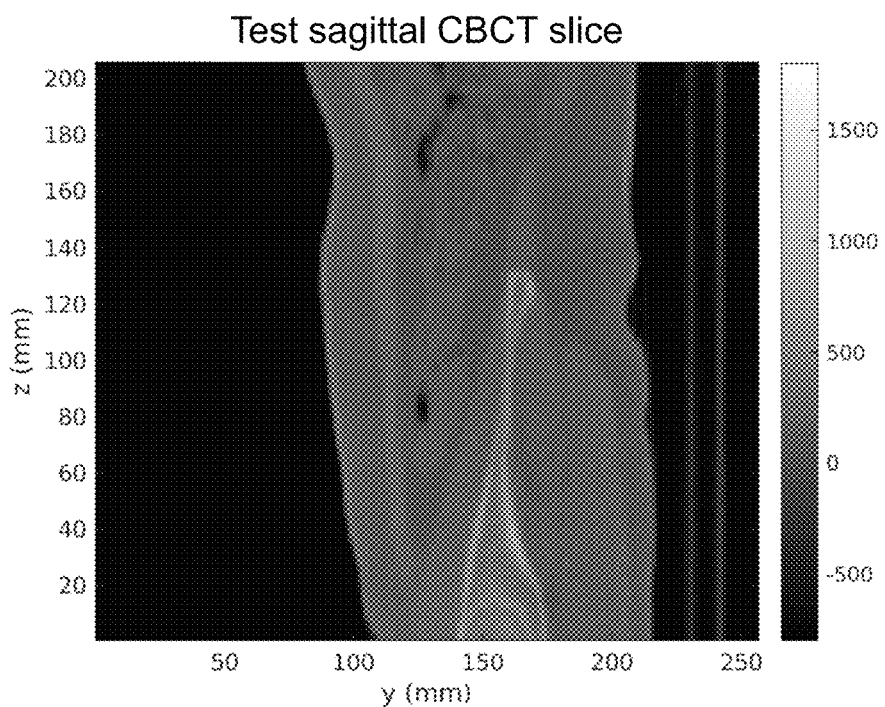
FIG. 12 is a schematic diagram illustrating an exemplary test sagittal CBCT slice according to some embodiments of the present disclosure.
Figure 13:
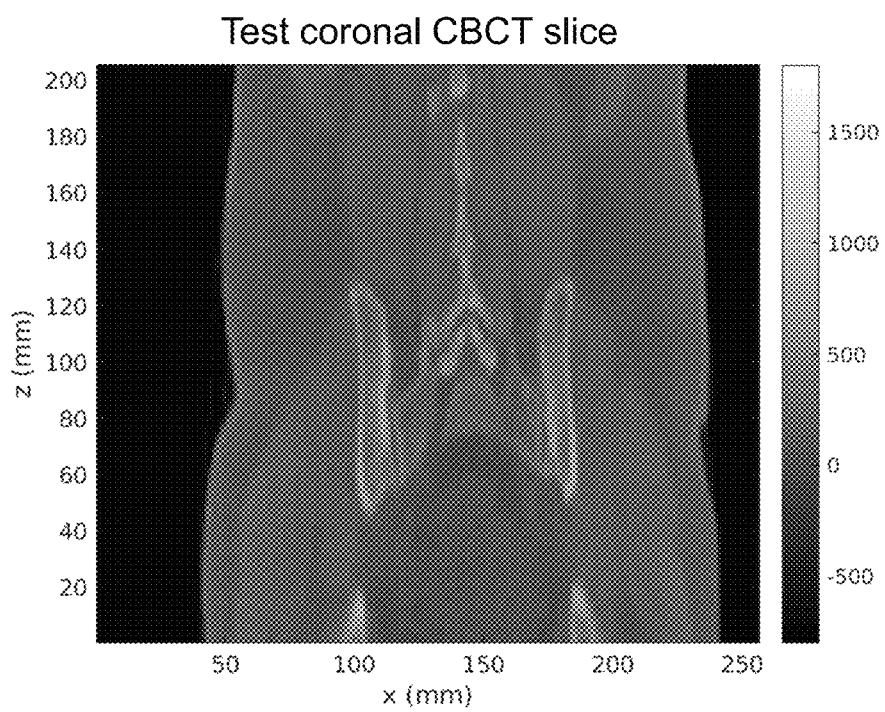
FIG. 13 is a schematic diagram illustrating an exemplary test coronal CBCT slice according to some embodiments of the present disclosure.

In some embodiments, a simulation operation as described in the process 700 was applied on the test MSCT image to synthesize a test CBCT image. A plurality of test CBCT slices were obtained from the test CBCT image along the first orientation, the second orientation, and the third orientation, respectively. FIG. 11 is a schematic diagram illustrating an exemplary test axial CBCT slice of the test CBCT image so obtained. FIG. 12 is a schematic diagram illustrating an exemplary test sagittal CBCT slice of the test CBCT image so obtained. FIG. 13 is a schematic diagram illustrating an exemplary test coronal CBCT slice of the test CBCT image so obtained.

Example 1

The first conversion model was applied to a plurality of test axial CBCT slices to obtain a plurality of processed test axial CBCT slices. Specifically, the plurality of test axial CBCT slices were input into the first conversion model, and the outputs of the first conversion model included the plurality of processed test axial CBCT slices. An axial converted 3D CBCT image was reconstructed based on the plurality of processed test axial CBCT slices. An axial slice, a sagittal slice, and a coronal slice of the axial converted 3D CBCT image are shown in FIGS. 14-16, respectively.

Figure 14:
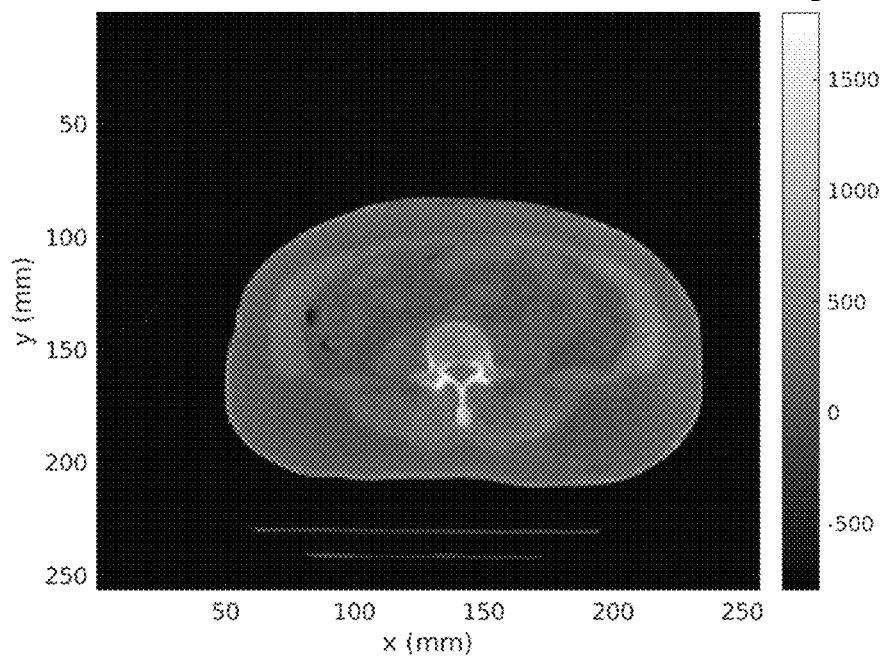
FIG. 14 is a schematic diagram illustrating an exemplary axial slice of an axial converted 3D CBCT image according to some embodiments of the present disclosure.
Figure 15:
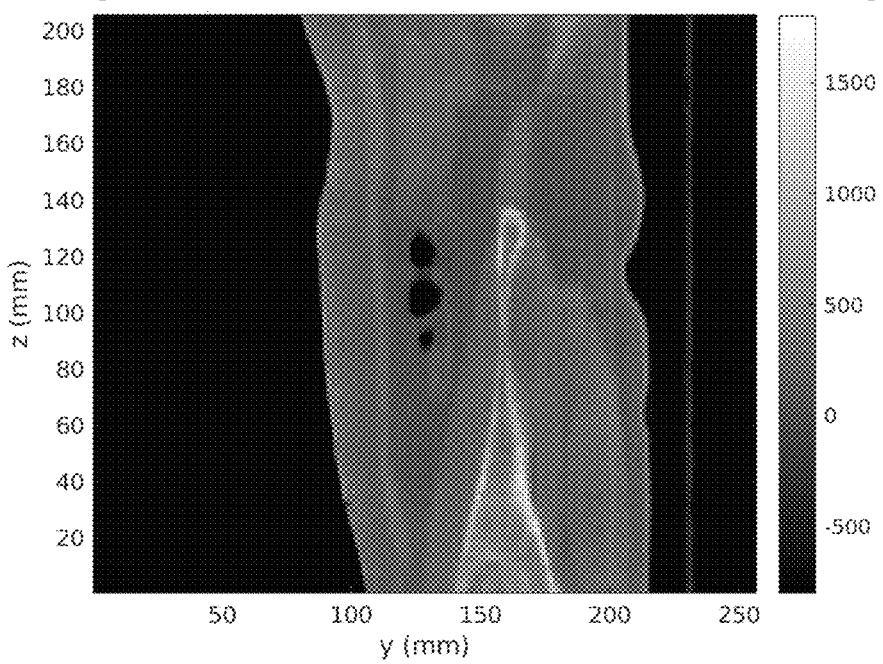
FIG. 15 is a schematic diagram illustrating an exemplary sagittal slice of an axial converted 3D CBCT image according to some embodiments of the present disclosure.
Figure 16:
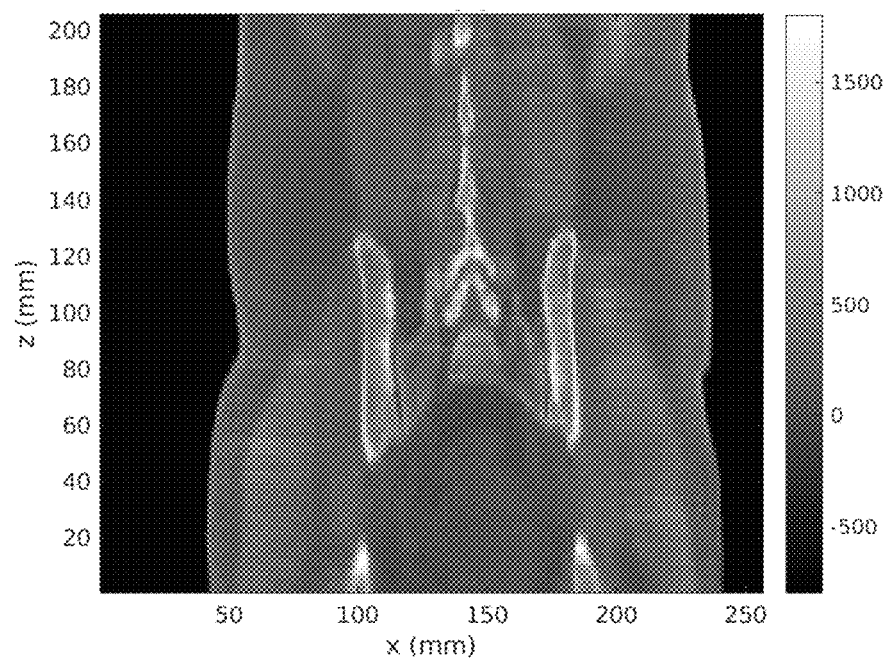
FIG. 16 is a schematic diagram illustrating an exemplary coronal slice of an axial converted 3D CBCT image according to some embodiments of the present disclosure.

As shown in FIGS. 14-16, the axial slice of the axial converted 3D CBCT image does not have slice-discontinuity artifacts (e.g., stepping artifacts), while the sagittal slice and the coronal slice of the axial converted 3D CBCT image have severe artifacts.

Example 2

Figure 17:
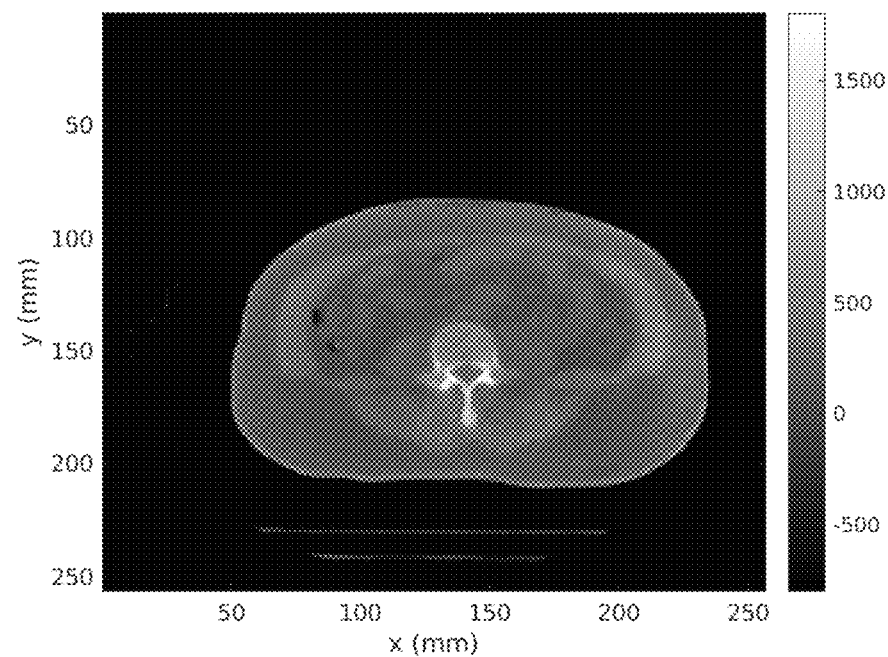
FIG. 17 is a schematic diagram illustrating an exemplary processed axial CBCT slice according to some embodiments of the present disclosure.
Figure 18:
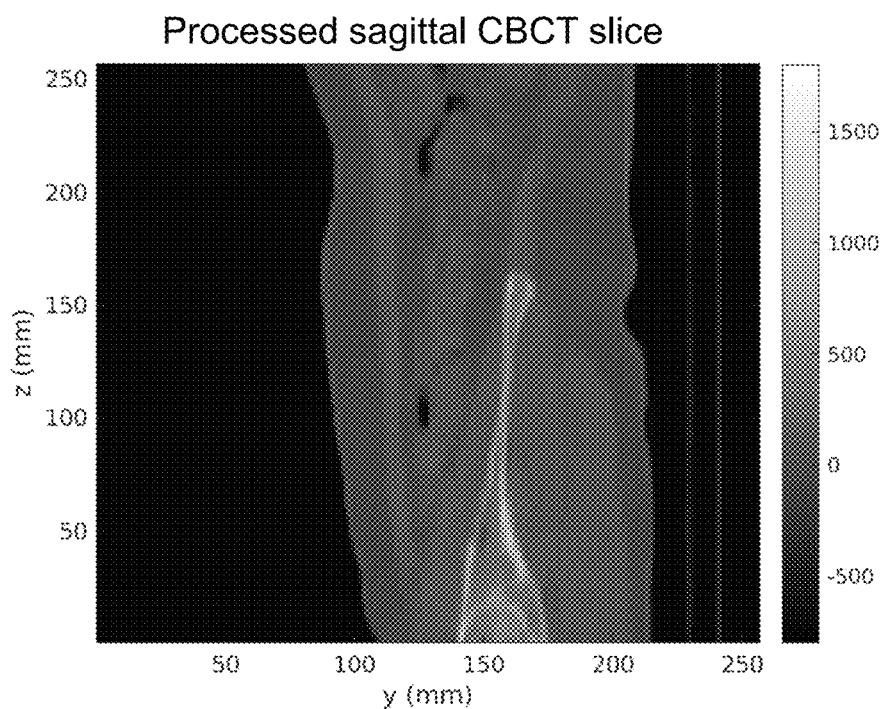
FIG. 18 is a schematic diagram illustrating an exemplary processed sagittal CBCT slice according to some embodiments of the present disclosure.

The first conversion model was applied to the test axial CBCT slice as shown in FIG. 11. The second conversion model was applied to the test sagittal CBCT slice as shown in FIG. 12. The third conversion model was applied to the test coronal CBCT slice as shown in FIG. 13. The output of the first conversion model (a processed axial CBCT slice) is shown in FIG. 17. The output of the second conversion model (a processed sagittal CBCT slice) is shown in FIG. 18. The output of the third conversion model (a processed coronal CBCT slice) is shown in FIG. 19.

Figure 19:
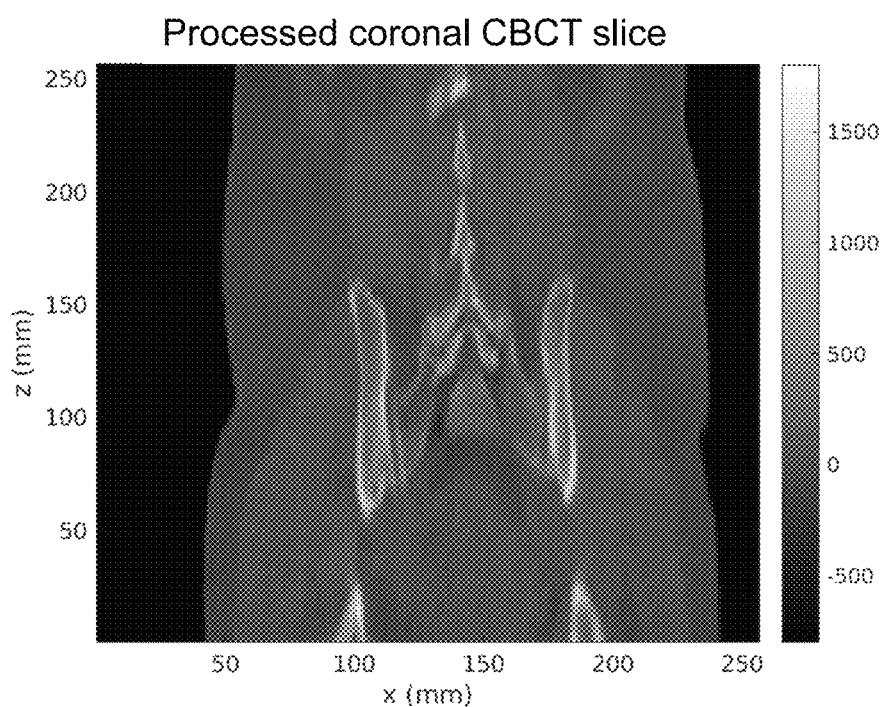
FIG. 19 is a schematic diagram illustrating an exemplary processed coronal CBCT slice according to some embodiments of the present disclosure.

As shown in FIGS. 17-19, the processed axial CBCT slice, the processed sagittal CBCT slice, and the processed coronal CBCT slice do not have slice-discontinuity artifacts, and the processed (axial, sagittal, and coronal) CBCT slices closely resemble the corresponding test (axial, sagittal, and coronal) MSCT slices in terms of contrast, contrast-to-noise ratio, or resolution.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure, or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer-readable media having computer-readable program code embodied thereon.

A non-transitory computer-readable signal medium may include a propagated data signal with computer readable program code embodied therein, for example, in baseband or as part of a carrier wave. Such a propagated signal may take any of a variety of forms, including electromagnetic, optical, or the like, or any suitable combination thereof. A computer-readable signal medium may be any computer-readable medium that is not a computer-readable storage medium and that may communicate, propagate, or transport a program for use by or in connection with an instruction execution system, apparatus, or device. Program code embodied on a computer-readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object-oriented programming language such as Java, Scala, Smalltalk, Eiffel, JADE, Emerald, C++, C#, VB. NET, Python, or the like, conventional procedural programming languages, such as the "C" programming language, Visual Basic, Fortran, Perl, COBOL, PHP, ABAP, dynamic programming languages such as Python, Ruby, and Groovy, or other programming languages. The program code may execute entirely on the user's computer, partly on the user's computer, as a stand-alone software package, partly on the user's computer and partly on a remote computer or entirely on the remote computer or server. The latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations, therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software-only solution, e.g., an installation on an existing server or mobile device.

Similarly, it should be appreciated that in the foregoing description of embodiments of the present disclosure, various features are sometimes grouped together in a single embodiment, figure, or description thereof to streamline the disclosure aiding in the understanding of one or more of the various inventive embodiments. This method of disclosure, however, is not to be interpreted as reflecting an intention that the claimed object matter requires more features than are expressly recited in each claim. Rather, inventive embodiments lie in less than all features of a single foregoing disclosed embodiment.

In some embodiments, the numbers expressing quantities, properties, and so forth, used to describe and claim certain embodiments of the application are to be understood as being modified in some instances by the term "about," "approximate," or "substantially." For example, "about," "approximate" or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting effect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. A system for processing a 3D image, comprising:
   at least one storage device including a set of instructions for processing the 3D image; and
   at least one processor in communication with the at least one storage device, wherein when executing the set of instructions, the at least one processor is directed to cause the system to perform operations including:
      for an orientation of the 3D image, and
         obtaining, from the 3D image, a plurality of slices of the orientation; and
         obtaining a plurality of processed slices of the orientation by processing the plurality of slices of the orientation using a deep learning model, wherein the deep learning model is obtained by a process including:
            obtaining a plurality of training samples each of which includes two corresponding images of different image qualities or different modalities; and
            obtaining the deep learning model by training a preliminary model based on the plurality of training samples.

2. The system of claim 1, wherein the at least one processor is directed to cause the system to perform the operations further including:
   determining a converted 3D image of the orientation based on the plurality of processed slices of the orientation.

3. The system of claim 1, wherein the at least one processor is directed to cause the system to perform the operations further including:
   obtaining, based on the plurality of processed slices, at least one second slice of the orientation to be displayed.

4. The system of claim 1, wherein the at least one processor is directed to cause the system to perform the operations further including:
   for a second orientation of the 3D image,
      obtaining, from the 3D image, a plurality of slices of the second orientation; and
      obtaining a plurality of processed slices of the second orientation by processing the plurality of slices of the second orientation using a second conversion model, wherein the deep learning model is different from the second conversion model, and the orientation is different from the second orientation.

5. The system of claim 4, wherein the at least one processor is directed to cause the system to perform the operations further including:
   determining a converted 3D image of the second orientation based on the plurality of processed slices of the second orientation.

6. The system of claim 4, wherein the at least one processor is directed to cause the system to perform the operations further including:
   obtaining, based on the plurality of processed slices of the second orientation, at least one second slice of the second orientation to be displayed.

7. The system of claim 1, wherein the training a preliminary model based on the plurality of training samples includes:
   for each of the plurality of training samples,
      obtaining, from an image of a first image quality or a first modality, a plurality of first slices of the orientation;
      obtaining, from an image of a second image quality or a second modality, a plurality of second slices of the orientation; and
      training the preliminary model using the plurality of first slices of the orientation as an input and the plurality of second slices of the orientation as an expected output.

8. The system of claim 1, wherein the orientation is associated with at least one of an axial plane, a coronal plane, or a sagittal plane of the 3D image.

9. The system of claim 1, wherein the deep learning model is a single conversion model used to process slices of a plurality of orientations, and the single conversion model is obtained by a process including:
   training a preliminary model using a plurality of sample slices of the plurality of orientations.

10. The system of claim 1, wherein the at least one processor is directed to cause the system to perform the operations further including:
    for a second orientation of the 3D image,
       obtaining, from the 3D image, a plurality of slices of the second orientation; and obtaining a plurality of processed slices of the second orientation by processing the plurality of slices of the second orientation using the deep learning model, the orientation is different from the second orientation.

11. The system of claim 1, wherein the deep learning model is an image style-transfer model configured to transfer each of the plurality of slices of the orientation from a first type to a second type.

12. The system of claim 7 claim 1, wherein the two corresponding images of different image qualities or different modalities include a sample multi-slice computed tomography (MSCT) image and a sample cone-beam computed tomography (CBCT) image.

13. The system of claim 7, wherein
the image of the first image quality or the first modality includes a sample CBCT image, and the plurality of first slices of the orientation include a plurality of sample CBCT slices of the orientation;
the image of the second image quality or the second modality includes a sample MSCT image, and the plurality of second slices of the orientation include a plurality of sample MSCT slices of the orientation.

14. The system of claim 12, wherein for at least one of the plurality of training samples, the sample CBCT image of the training sample is determined by applying a simulation operation on the sample MSCT image of the training sample.

15. The system of claim 14, wherein the simulation operation includes:
transforming the sample MSCT image into at least one 3D array;
obtaining projection values of the sample MSCT image by performing a projection algorithm and a noise simulation algorithm on the sample MSCT image based at least in part on the at least one 3D array; and
obtaining the sample CBCT image by reconstructing the projection values using a reconstruction algorithm.

16. A method for processing a 3D image, implemented on a computing device including one or more processors and one or more storage devices, the method comprising:
for an orientation of the 3D image,
obtaining, from the 3D image, a plurality of slices of the orientation; and
obtaining a plurality of processed slices of the orientation by processing the plurality of slices of the orientation using a deep learning model, wherein the deep learning model is obtained by a process including:
obtaining a plurality of training samples each of which includes two corresponding images of different image qualities or different modalities; and
obtaining the deep learning model by training a preliminary model based on the plurality of training samples.

17. The method of claim 16, wherein the method further including:
determining a converted 3D image of the orientation based on the plurality of processed slices of the orientation.

18. The method of claim 16, wherein the method further including:
obtaining, based on the plurality of processed slices, at least one second slice of the orientation to be displayed.

19. A non-transitory computer readable medium, comprising at least one set of instructions, wherein when executed by at least one processor of a computing device, the at least one set of instructions direct the at least one processor to perform operations including:
for an orientation of the 3D image,
obtaining, from the 3D image, a plurality of slices of the orientation; and
obtaining a plurality of processed slices of the orientation by processing the plurality of slices of the orientation using a deep learning model, wherein the deep learning model is obtained by a process including:
obtaining a plurality of training samples each of which includes two corresponding images of different image qualities or different modalities; and
obtaining the deep learning by training a preliminary model based on the plurality of training samples.

* * * * *